United States Patent
Akiyama

(10) Patent No.: US 6,559,905 B1
(45) Date of Patent: May 6, 2003

(54) ACTIVE MATRIX SUBSTRATE AND METHOD OF MANUFACTURING THE SAME

(75) Inventor: Masahiko Akiyama, Tokyo (JP)

(73) Assignee: Kabushiki Kaisha Toshiba, Kawasaki (JP)

(*) Notice: Subject to any disclaimer, the term of this patent is extended or adjusted under 35 U.S.C. 154(b) by 0 days.

(21) Appl. No.: 09/602,298

(22) Filed: Jun. 23, 2000

(30) Foreign Application Priority Data

Jun. 25, 1999 (JP) .............................. 11-179214

(51) Int. Cl.⁷ .......................................... G02F 1/1333
(52) U.S. Cl. .................................................. 349/45
(58) Field of Search .......................... 149/45, 42, 43, 149/47, 52

(56) References Cited

U.S. PATENT DOCUMENTS 5,339,180 A * 8/1994 Katoh ........................ 359/58
5,834,327 A * 11/1998 Yamazaki et al. ............ 438/30
6,140,980 A * 10/2000 Spitzer et al. ................. 345/8

FOREIGN PATENT DOCUMENTS

| JP | 7-311391 | 11/1995 |
|---|---|---|
| JP | 10-125931 | 5/1998 |
| JP | 10-268332 | 10/1998 |
| JP | 11-142878 | 5/1999 |
| JP | 11142878 | * 5/1999 |

* cited by examiner

Primary Examiner—Toan Ton
Assistant Examiner—Hoan Nguyen
(74) Attorney, Agent, or Firm—Oblon, Spivak, McClelland, Maier & Neustadt, P.C.

(57) ABSTRACT

A method of manufacturing an active matrix substrate comprises forming a plurality of elements on an element formation substrate, forming wirings on a final substrate, transferring some elements selected from the elements, and selectively connecting some elements to the wirings on the final substrate. According to this method, it is possible to manufacture an active matrix substrate providing a high definition image on a large substrate or a non-glass substrate, at a low cost.

27 Claims, 14 Drawing Sheets

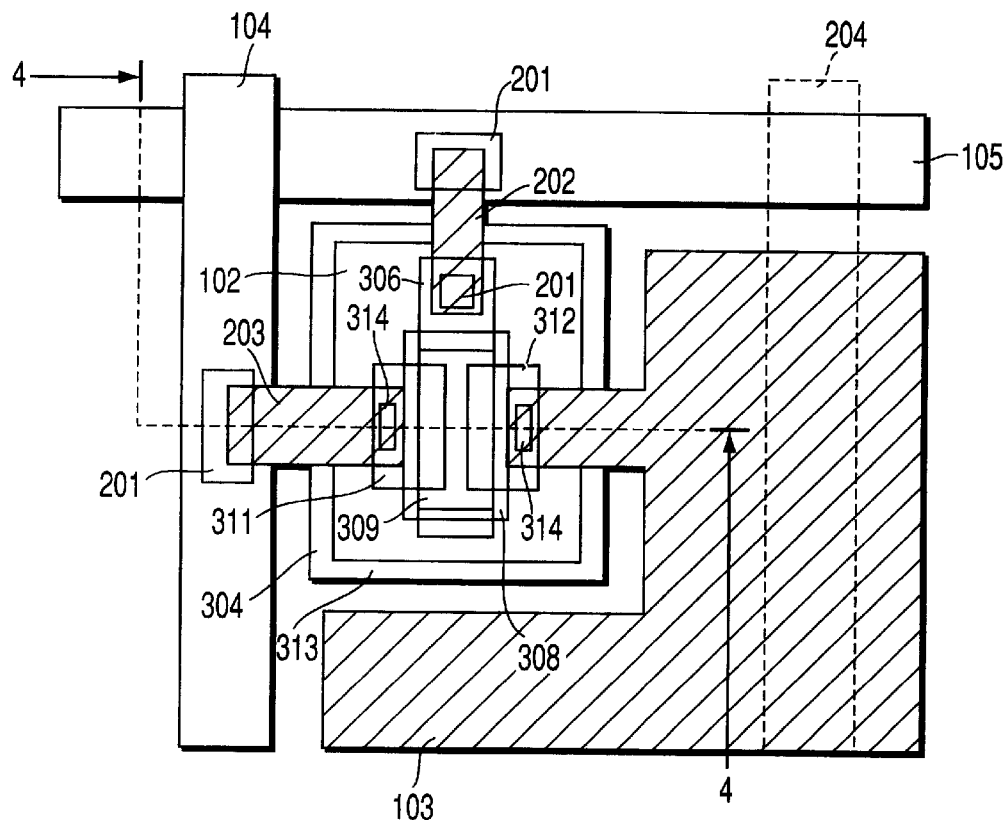
F I G. 3
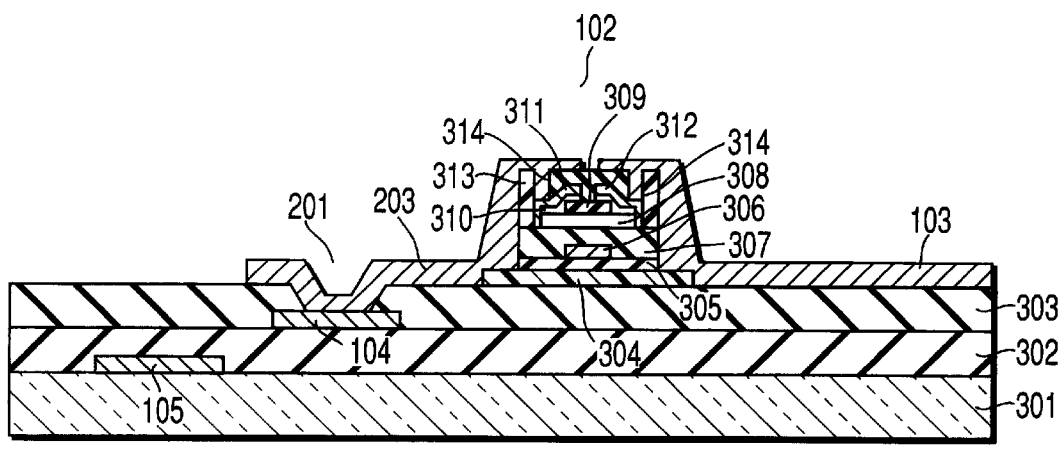
F I G. 4

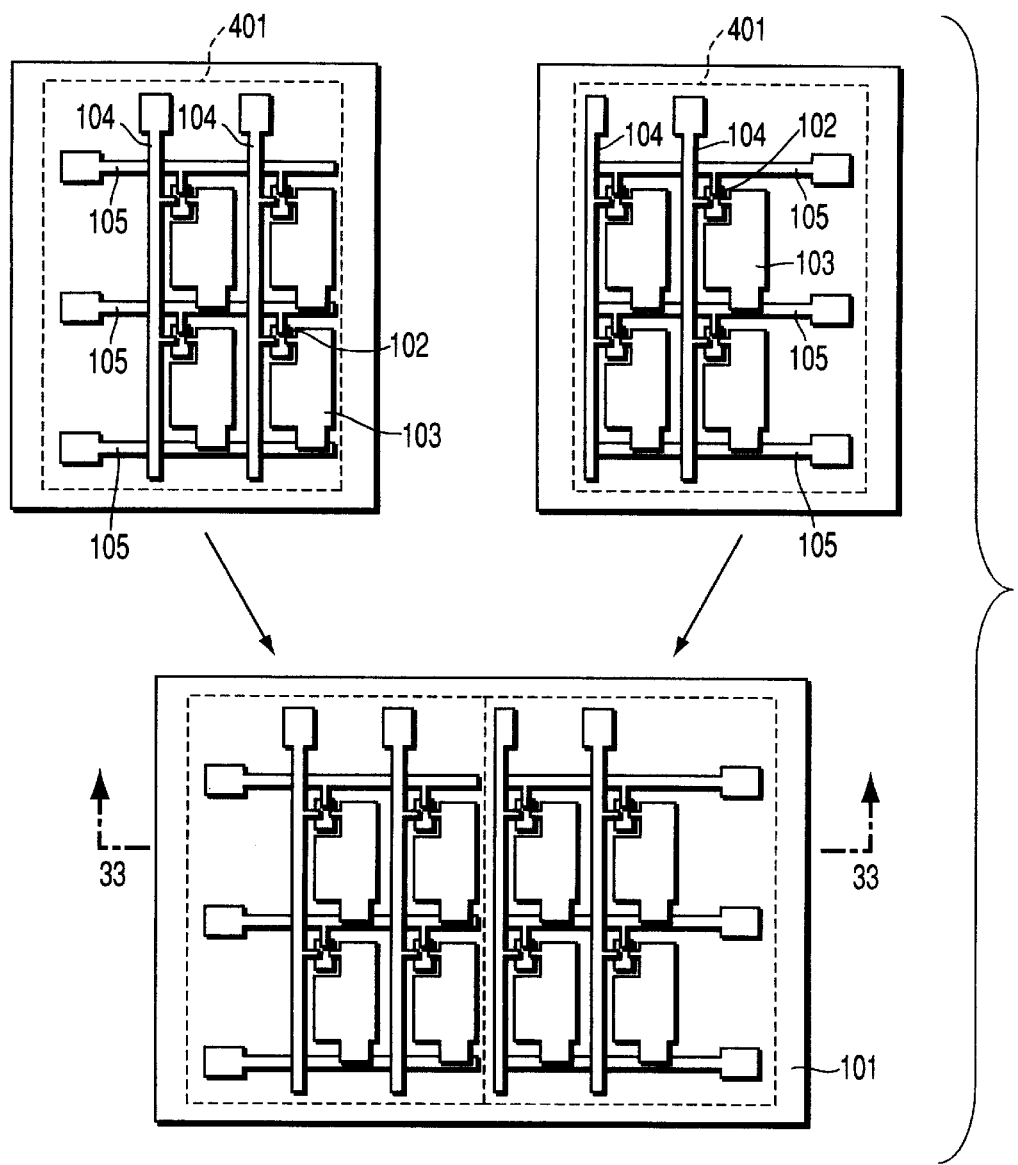
F I G. 32
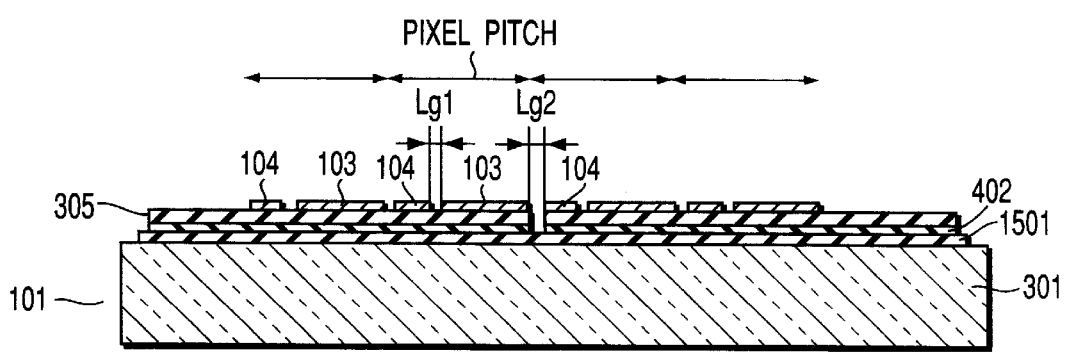
F I G. 33

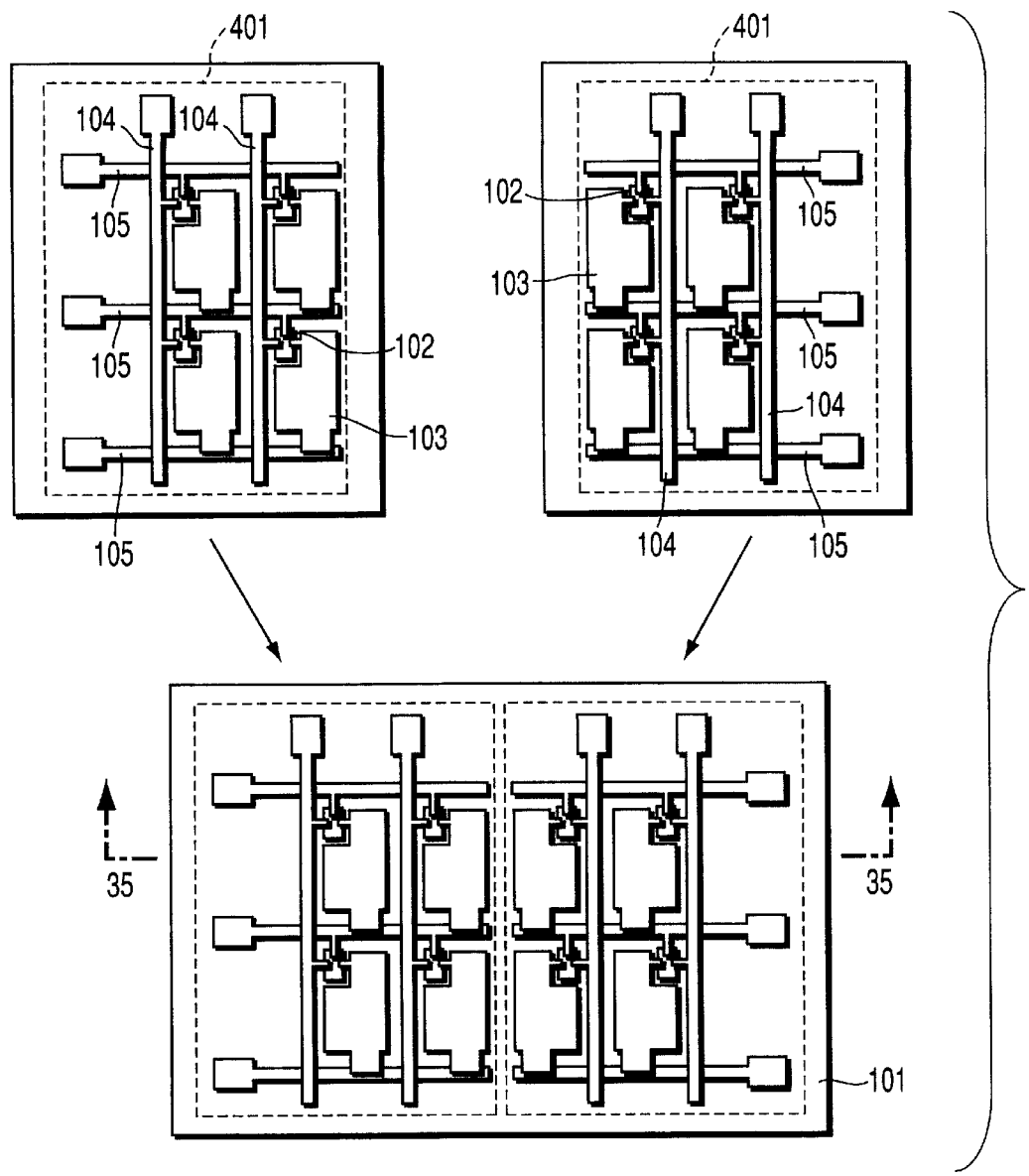
F I G. 34
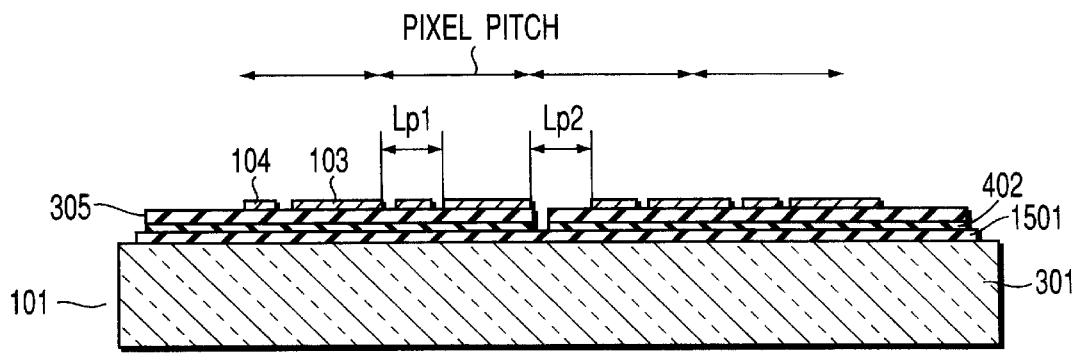
F I G. 35

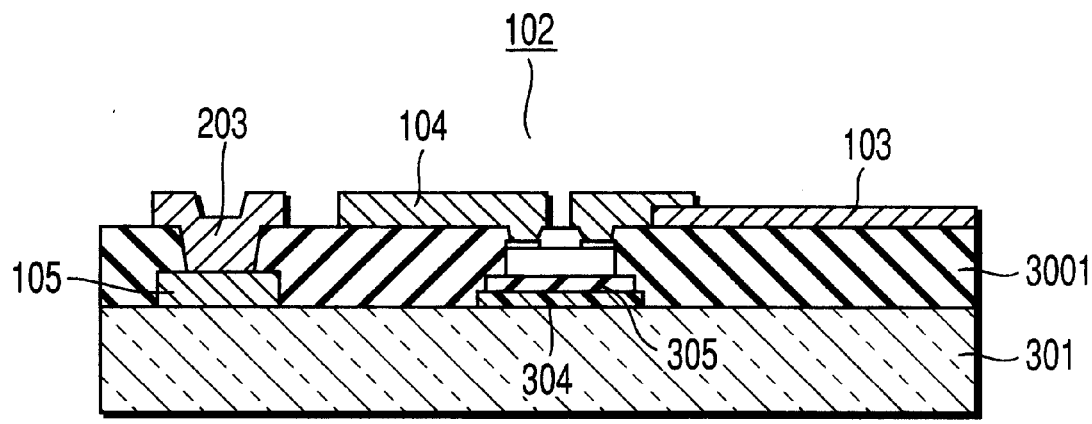
F I G. 36
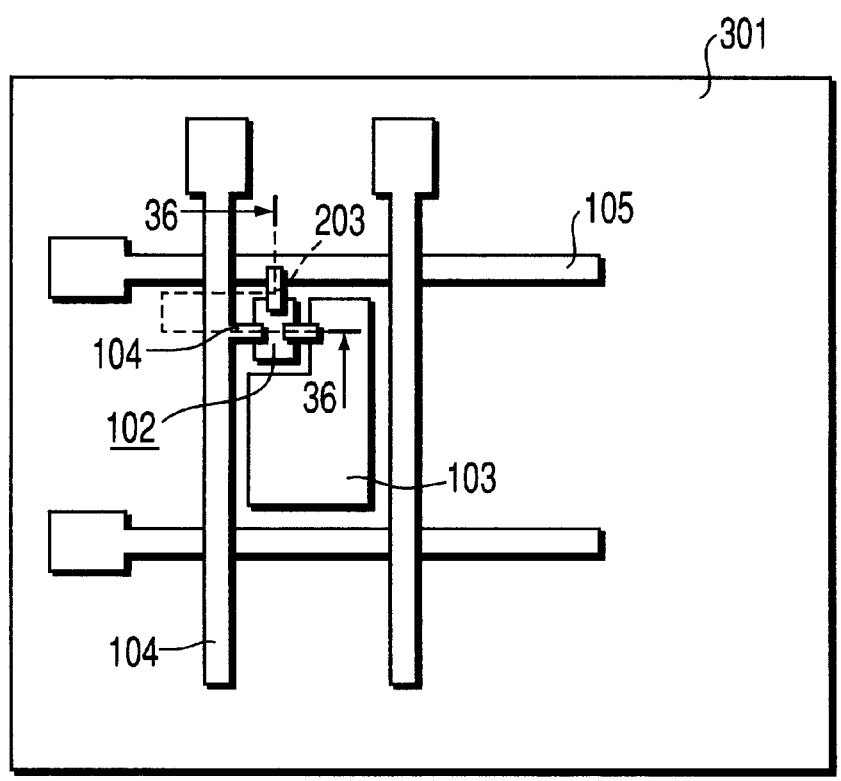
F I G. 37

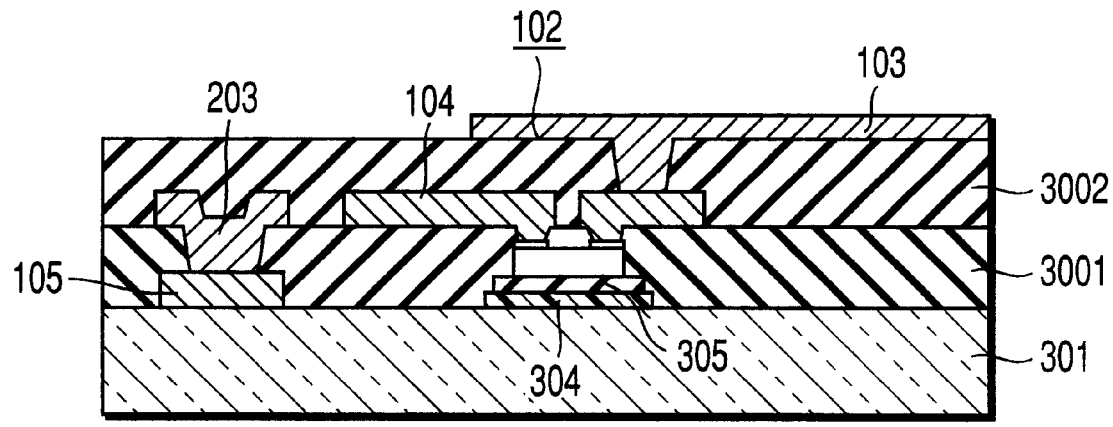
F I G. 38
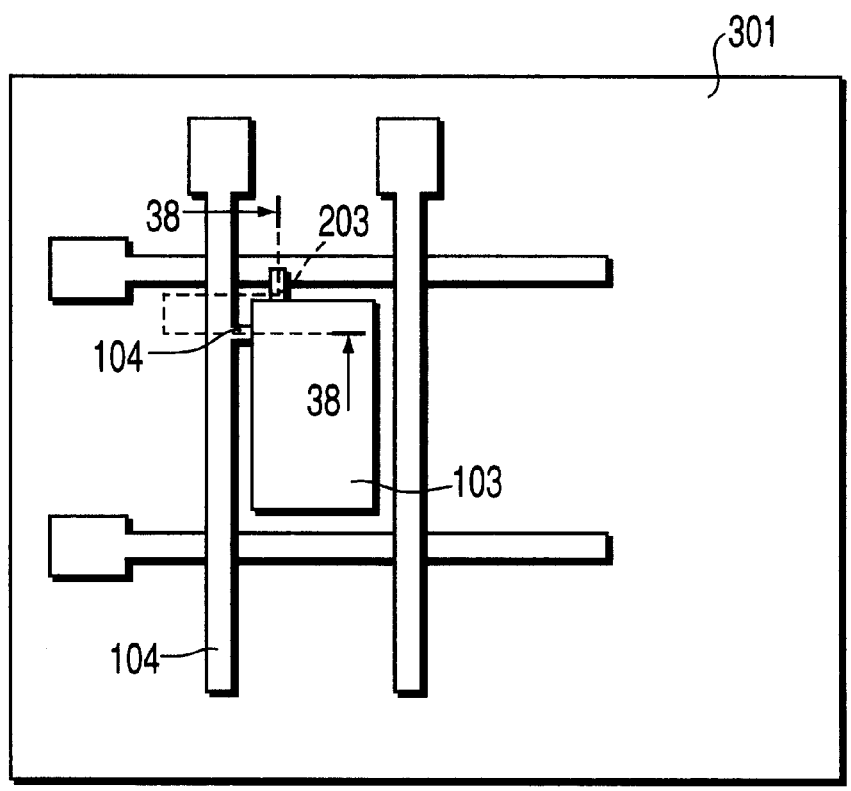
F I G. 39

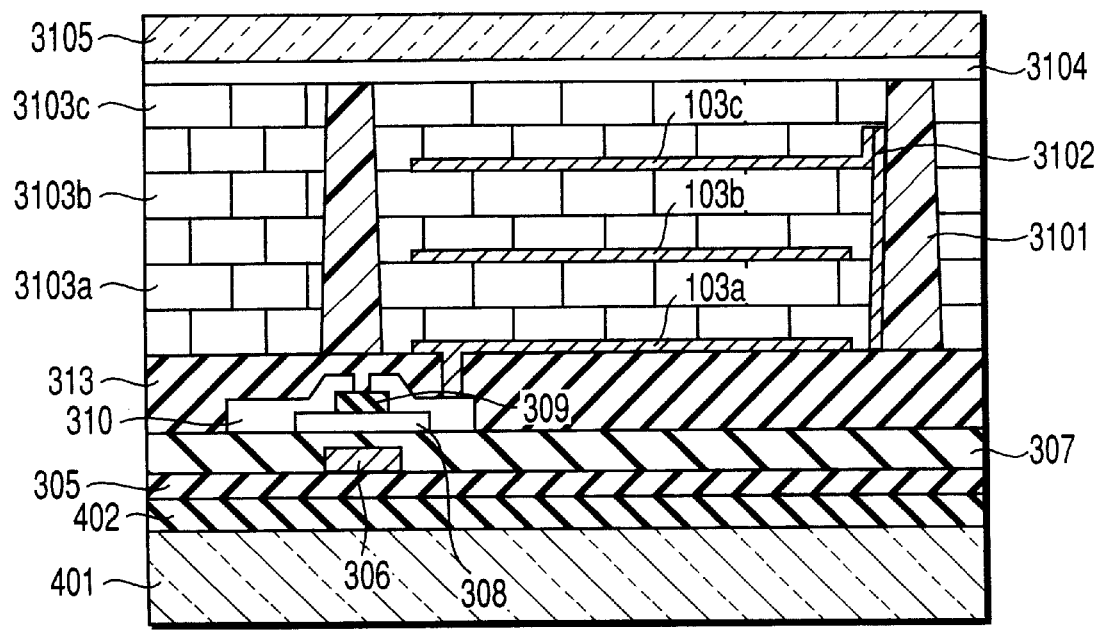
F I G. 40
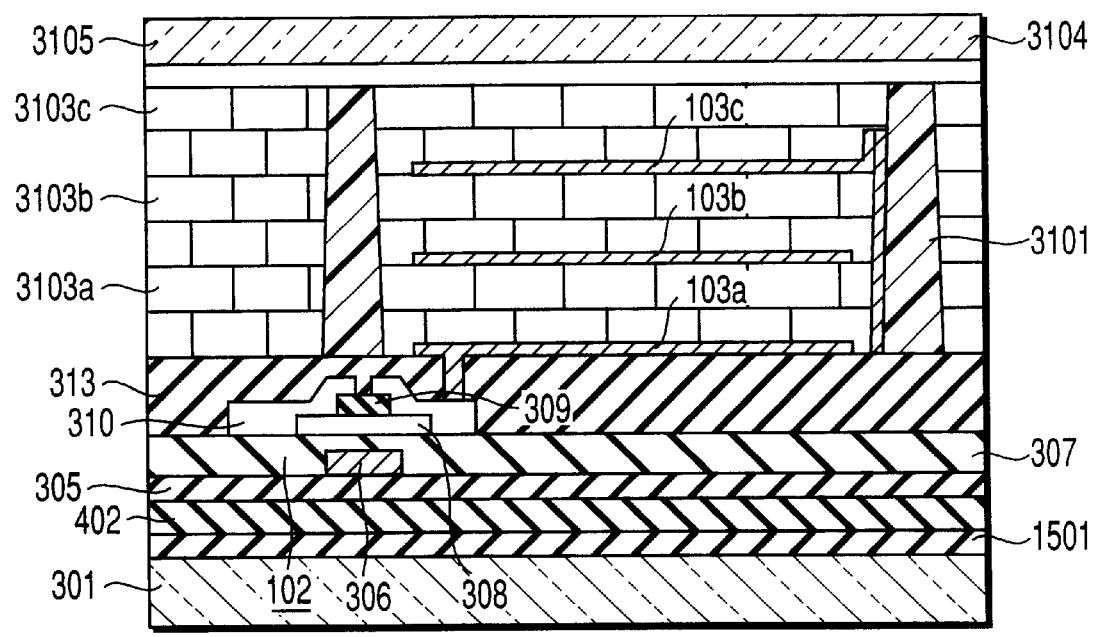
F I G. 41

ACTIVE MATRIX SUBSTRATE AND METHOD OF MANUFACTURING THE SAME

CROSS-REFERENCE TO RELATED APPLICATIONS

This application is based upon and claims the benefit of priority from the prior Japanese Patent Application No. 11-179214, filed Jun. 25, 1999, the entire contents of which are incorporated herein by reference.

BACKGROUND OF THE INVENTION

The present invention relates to an active matrix substrate for a liquid crystal display device and a method of manufacturing the same.

Liquid crystal display devices (LCD) are advantageous since they are formed thin and display color images with low power consumption. By virtue of these advantages, the LCDs are widely used for lap-top personal computers. The image quality of the LCDs is good enough to be employed not only for electric-data display devices but also for TV screens.

Of the LCD devices, an active matrix type LCD is used as a flat panel display capable of providing full-color images with a high quality. The active matrix type LCD is formed of a first glass substrate, a second glass substrate and liquid crystal which is injected between the first and the second glass substrate. In the first glass substrate, thin transistors (TFT), which employ amorphous silicon or poly crystalline silicon as an active layer, are arranged in a matrix form. The second glass substrate is fixed so as to face the first glass substrate with a gap of about 5 $\mu$m interposed between them.

FIG. 1 shows a cross-sectional view of a pixel portion of a conventional active matrix type LCD.

A scanning line 3502 and a storage capacitor line 3503 are formed on a glass substrate 3501. A gate insulating film 3504 is formed over the lines 3502 and 3503. Furthermore, a pixel electrode 3505 is selectively formed on the gate insulating film 3504.

Reference numeral 3506 is a TFT portion, which is formed of a semiconductor layer 3507, a channel protecting insulating film 3508 formed on the semiconductor layer 3507, and two doped semiconductor layers 3509 facing each other. The two doped semiconductor layers are formed in contact with the semiconductor layer 3507 while an end portion of each of the doped semiconductor layers is mounted on the channel protecting insulating film 3508. A source electrode 3510 and a drain electrode 3511 are formed respectively on the two doped semiconductor layers 3509. The source electrode 3510 is connected to a signal line (not shown). The drain electrode 3511 is connected to the pixel electrode 3505. A protective insulating film 3512 is formed over the TFT portion 3506.

With recent technical development, a field of view has been widened. Accordingly, a narrow viewing angle of the LCD has been overcome. In addition to this, since the TFT array can be formed on the glass substrate, a relatively large display having a diagonal length of about 10 to 25 inches has been realized.

However, to realize a high definition TV (HDTV), a large screen having a diagonal length of about 40–60 inches is desired. To manufacture the TFT array for such a large screen, it is necessary to construct an assembly line capable of holding an ultra-large glass substrate larger than 1 m square. A large equipment cost is inevitably required.

A method of making the large screen by jointing a plurality of substrates carrying TFT arrays is disclosed in Japanese Patent Applicaltion KOKAI publication No. 10-268332. However, this method has the following problems. Since the substrates are not jointed accurately, an aperture ratio of the joint portion is low. It is difficult to accurately control the level of the joint portion between the substrates, taking the thickness (5 $\mu$m) of the liquid crystal layer into consideration. Therefore, a large quantity of the substrates are not manufactured.

On the other hand, a mobile data terminal equipment providing electronic data anytime and anywhere was developed by making use of "low power consumption" of the LCD. The mobile data terminal equipment has been used in a wide variety of fields. In future, it is expected that electronic data will be displayed with the same ultra precision as that of printing matter, that is, about 150–300 pixel/inch (ppi).

These mobile data terminal equipments have to be formed light with a low power consumption. When a liquid crystal display is formed on an A4-size glass substrate of about 0.7 mm-thick, the total weight of the display results in 220 g. If the weight of the bezel for fixing the display is included, the total weight of the device will be about 400 g or more.

The weight of the display device can be reduced by about ½ if a plastic substrate is employed. The weight can be further reduced, if a film substrate is used. Such a display device is suitable for use in the mobile data terminal equipment. In these circumstances, attempts have been made to form the TFTs on the plastic substrate or the film substrate. When the TFTs are formed on these substrates, however, it is necessary to reduce the processing temperature. If the TFTs are formed at a low processing temperature, performance of the TFTs may be degraded, with the result that limitations may be imposed on image quality and the number of pixels. Furthermore, the thermal expansion coefficiency of these substrates is high and plastic deformation occurs at a low temperature. For these reasons, it is conceivable that the high definition display device may not be attained.

BRIEF SUMMARY OF THE INVENTION

An object of the present invention is to provide an active matrix substrate for achieving the formation of a high definition image at a low cost even if a large substrate or a non-glass substrate is used, and also provide a method for manufacturing the same.

According to a first aspect of the present invention, to attain the aforementioned objects, there is provided a method of manufacturing an active matrix substrate comprising:

a first step of forming a plurality of elements on a first substrate;

a second step of forming wirings on a second substrate;

a third step of transferring some elements selected from the plurality of elements onto the second substrate from the first substrate; and a fourth step of selectively connecting the some elements transferred onto the second substrate to the wirings.

According to a second aspect of the present invention, there is provided a method of manufacturing an active matrix substrate comprising:

a first step of forming a plurality of elements on a first substrate;

a second step of transferring some elements selected from the plurality of elements onto a second substrate from the first substrate;

a third step of forming wirings on the second substrate after the second step; and a fourth step of selectively connecting the some elements and the wirings.

In the methods of manufacturing an active matrix substrate according to the first and second aspects, it is preferable that the following steps be carried out.

The third step includes the steps of:

adhering the plurality of elements formed on the first substrate onto the third substrate;

etching away the first substrate; and transferring the some elements selected from the plurality of elements adhered on the third substrate to the second substrate.

The third step includes the steps of:

forming an adhesion layer on the third substrate;

transferring the plurality of elements formed on the first substrate onto the third substrate via the adhesion layer; and selectively heating portions of the adhesion layer on which the some elements are formed, to thereby transfer the some elements from the third substrate to the second substrate.

In the aforementioned step, the elements may be removed from the element formation substrate by laser irradiation in place of heat application. Alternatively, the elements formed on the element formation substrate may be transferred on the adhesion layer which is heated and further transferred from the intermediate transfer substrate to the final substrate by UV irradiation.

The third step includes a step of selecting the some elements such that a largest interval of two adjacent elements arbitrarily chosen from the some elements is larger than a largest interval of two adjacent elements arbitrarily chosen from the plurality of elements formed on the first substrate.

The third step includes a step of selecting the some elements at predetermined intervals thereamong, and a step of repeating the step of selecting the some elements.

The first step includes the steps of:

forming an underlying layer on the first substrate;

forming the plurality of elements on the underlying layer; and forming a protective layer individually on each of the plurality of elements, such that the plurality of elements are covered with the underlying layer and the protective layer.

The method of the present invention further comprises a step of separating the underlying layer into sections such that the underlying layer remains only just under each of the plurality of elements.

Note that the underlying layer is desirably a stacked layered composed of an etching stopper layer formed on the first substrate and an undercoat layer formed on the etching stopper layer.

According to a third aspect of the present invention, there is provided a method of manufacturing an active matrix substrate comprising:

a first step of forming an underlying layer on a first substrate;

a second step of forming a plurality of circuit units, on the underlying layer, composed of at least one element and at least one wiring connected to the at least one element;

a third step of adhering the plurality of circuit units formed on the first substrate to a third substrate via an adhesion layer formed on the third substrate;

a fourth step of etching away the first substrate; and a fifth step of selectively transferring the plurality of circuit units adhered onto the third substrate to the second substrate.

The method of manufacturing an active matrix substrate according to the third aspect of the present invention may be carried out as follows.

The fifth step includes a step of selectively heating portions of the adhesion layer on which some circuit units to be transferred are formed, to thereby transfer the circuit units from the third substrate to the second substrate.

The second step includes a step of forming a protective layer individually on each of the plurality of circuit units, such that the plurality of circuit units are covered with the underlying layer and the protective layer.

The method according to a third aspect of the present invention further comprises a step of separating the underlying layer into sections such that the underlying layer remains only just under each of the plurality of circuit units.

The first step includes a step of forming a stacked-layer film composed of an etching stopper layer on the first substrate and an undercoat layer formed on the etching stopper layer.

Each of the plurality of circuit units includes a plurality of pixel electrodes, and the fifth step is repeated a plurality of times such that an interval between adjacent electrodes of the plurality of pixel electrodes is kept substantially constant through the plurality of circuit units transferred.

According to a fourth aspect of the present invention, there is provided an active matrix substrate comprising:

a substrate;

an adhesion layer formed on the substrate;

an undercoat layer formed on the adhesion layer a plurality of elements formed on the undercoat layer;

wherein the adhesion layer and the undercoat layer are separated such that the adhesion layer and the undercoat layer remain only just under each of the plurality of elements.

A substrate formation substrate for use in manufacturing the active matrix substrate comprises:

a substrate;

an exfoliation layer formed on the substrate for being removed by heat application; and elements formed on the exfoliation layer at the same height, the elements being electrically isolated from each other.

An intermediate transfer substrate for use in manufacturing the active matrix substrate comprises:

a substrate;

an exfoliation layer formed on the substrate for being removed by heat application;

elements formed on the exfoliation layer at the same height, the elements being electrically isolated from each other.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 3 is an enlarged view of a TFT portion of FIG. 2;

FIG. 4 is a cross-sectional view taken along the line 4—4 of FIG. 3;

FIG. 32 is a plan view of the active matrix substrate for explaining a method of manufacturing the active matrix substrate by using two element formation substrates in the second embodiment;

FIG. 33 is a cross-sectional view of a substrate taking along the line 33—33 of FIG. 32;

FIG. 34 is a plan view of the active matrix substrate for explaining another method of forming the active matrix substrate by using two element formation substrates in the second embodiment;

FIG. 35 is a cross-sectional view taken along the line 35—35 of FIG. 34;

FIG. 36 is a cross-sectional view of the active matrix substrate for explaining a method of forming wiring on a final transfer substrate after the TFT element is transferred, according to a third embodiment of the present invention;

FIG. 37 is a partial plan view of the final transfer substrate according to the third embodiment (FIG. 36 corresponds to a cross sectional view taken along the line 36—36 of FIG. 37);

FIG. 38 is a cross-sectional view of a modified example of the third embodiment;

FIG. 39 is a partial plan view of the final transfer substrate according the modified example of the third embodiment (FIG. 38 is a cross-sectional view taken along the line 38—38 of FIG. 39);

FIG. 40 is a partial cross-sectional view of a substrate for explaining a method of forming a micro-capsule liquid crystal display device on an element formation substrate, in a fourth embodiment of the present invention; and FIG. 41 is a cross-sectional view of a substrate for explaining a method of forming a micro-capsule liquid crystal display device transferred on a final transfer substrate in the fourth embodiment of the present invention.

DETAILED DESCRIPTION OF THE INVENTION

Now, embodiments of the present invention will be explained with reference to the accompanying drawings.

First Embodiment

In the first embodiment, an active matrix substrate is formed by forming an amorphous silicon TFT (hereinafter, simply referred to as "TFT") on an element formation substrate (first substrate), transferring the TFT onto an intermediate transfer substrate (third substrate), and thereafter transferring the TFT to a final transfer substrate (second substrate) having wiring formed thereon.

Figure 1:
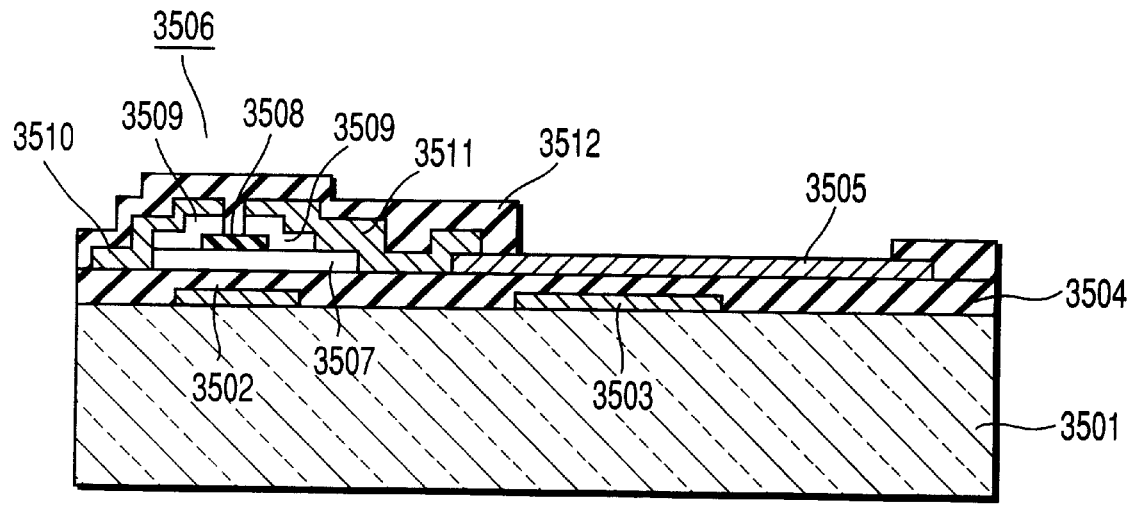
FIG. 1 is a cross-sectional view of a pixel portion of a conventional active matrix type LCD.
Figure 2:
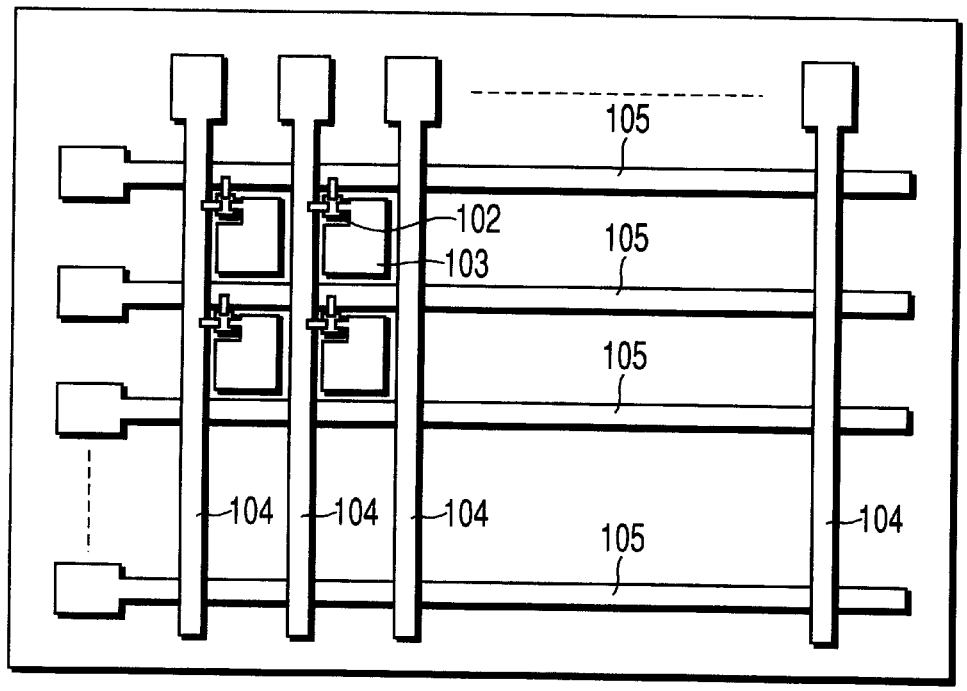
FIG. 2 is a partial plan view of an active matrix substrate according to a first embodiment of the present invention.

A plan view of an entire active matrix substrate 101 of this embodiment is shown in FIG. 2. A single TFT portion of FIG. 2 is enlarged in FIG. 3. A cross-sectional view taken along the line 4—4 of FIG. 3 is shown in FIG. 4.

Now, the structure of the active matrix substrate 101 of this embodiment will be explained with reference to FIG. 4. Note that details of the TFT portion shown in FIG. 3 are omitted in FIG. 2. As shown in FIG. 2, a plurality of pixels are arranged on the active matrix substrate 101 like an array. In each pixel, a TFT 102 and a pixel electrode 103 are provided. Each TFT 102 is connected to the pixel electrode 103, a signal line 104, and a scanning line 105.

FIG. 4 shows each pixel. The scanning line 105 is formed on a final transfer substrate 301 made of glass. Further, an interlayer insulating layer 302, the signal line 104, and a flattening layer 303 are stacked on the final transfer substrate 301. The TFT 102 is formed on the resultant structure by successively stacking an adhesion layer 304, an undercoat layer 305, a gate electrode 306, a gate insulating layer 307, a semiconductor layer 308, and a channel protecting insulating layer 309. Further on this structure, two n-type semiconductor layers 310 are formed so as to cover an upper portion of a channel protecting insulating layer 309. The two n-type semiconductor layers 310 are also connected to the semiconductor layer 308. A source electrode 311 and a drain electrode 312 are formed respectively on the two n-type semiconductor layers 310. Further on the layer 310, a passivation layer 313 is formed. A contact hole 314 is formed in the portions of the passivation layers 313 on the source electrode 311 and the drain electrode 312. The pixel electrode 103 is formed on the flattening layer 303 in contact with the drain electrode 312.

As shown in FIG. 3, a contact portion 201 is formed in each of the scanning line 105 and the gate electrode 306. The scanning line 105 and the gate electrode 306 are connected by way of a connecting wiring element 202. The signal line 104 is connected to the source electrode 311 of the TFT 102 by way of the contact portion 201, the connecting electrode 203, and the contact hole 314.

A storage capacitor line 204 may be provided in the pixel electrode 103 as shown in FIG. 3. The storage capacitor line 204 is responsible not only for retaining voltage of the pixel electrode 305 but also preventing a capacitive coupling noise, which is induced by a scanning-line pulse and applied to the liquid crystal, from being dependent upon a signal voltage. The storage capacitor line 204 is formed in the same layer of the signal line 104 and in parallel to the signal line 104, in FIG. 3. In another case considering the aperture ratio and the like, the storage capacitor line 204 may be formed in the same layer of the scanning line 105 and in parallel to the scanning line 105. This is effective for improving the aperture ratio with respect to the lengthwise pixel. Alternatively, the storage capacitor may be formed on the scanning line dedicated to the just previous pixel in the scanning direction, with the electrode thereof over lapping thereon. In this case, the storage capacitor line is assumed to be the just previous scanning line. The storage capacitor line 204 is connected to a power supply source (not shown), from which an appropriate voltage may be applied to the storage capacitor line 204.

Figure 5A:
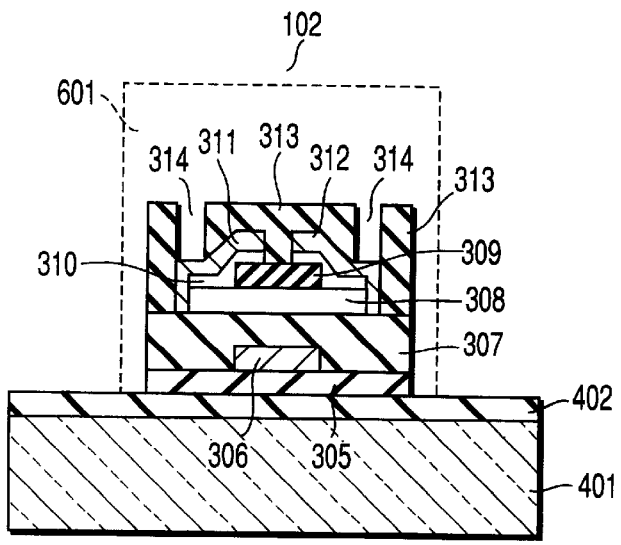
FIG. 5A is a cross sectional view of the TFT portion formed on an element formation substrate according to the first embodiment.

Now, a method of forming the TFT 102 on the element formation substrate 401 will be first explained with reference to FIG. 5A.

An etching stopper layer 402 is formed on an element formation substrate 401 made of glass. The etching stopper layer 402 serves as an etching stopper against a hydrofluoric-acid-based etchant in a glass etching step performed later. A metal oxide film such as a tantalum oxide film or a nitride film is usually used as the etching stopper layer 402.

Then, on the resultant structure, an undercoat layer 305 of a silicon oxide film or silicon nitride film is formed. Furthermore, the gate electrode 306 is formed of MoTa or MoW on the undercoat layer 305. Thereafter, a gate insulating layer 307 is formed on the gate electrode 306 in a thickness of about 400 nm by depositing a silicon nitride film in accordance with a plasma CVD method so as to cover it. The gate insulating layer 307 may be a stacked film of a silicon nitride film and a silicon oxide film.

An amorphous silicon layer serving as a semiconductor layer 308 is formed in a thickness of about 50 nm. Subsequently, a silicon nitride film serving as a channel protecting insulating layer 309 is formed-in a thickness of about 100–400 nm. Thereafter, a channel protecting insulating layer 309 is formed above the gate electrode 306 in self-alignment therewith by light exposure applied from a rear surface of the substrate.

Then, a phosphorus-doped n-type semiconductor layer 310 is formed by CVD, followed by etching the n-type semiconductor layer 310 and the semiconductor layer 308 each to be an island shape. Subsequently, the source electrode 311 and the drain electrode 312 are formed on the n-type semiconductor layer 310. The n-type semiconductor layer 310 is patterned to selectively remove the n-type semiconductor layer 310 on the channel protecting insulating layer 309 using the source electrode 311 and the drain electrode 312 as a mask. Furthermore, the passivation layer 313 is formed of a silicon nitride film by plasma CVD. A contact hole 314 is selectively formed in the paissivation layer just above the source electrode 311 and the drain electrode 312. The height of the TFT 102 from the undercoat layer 305 to the passivation layer 313 is set at about 500 nm to 2 μm.

Figure 5B:
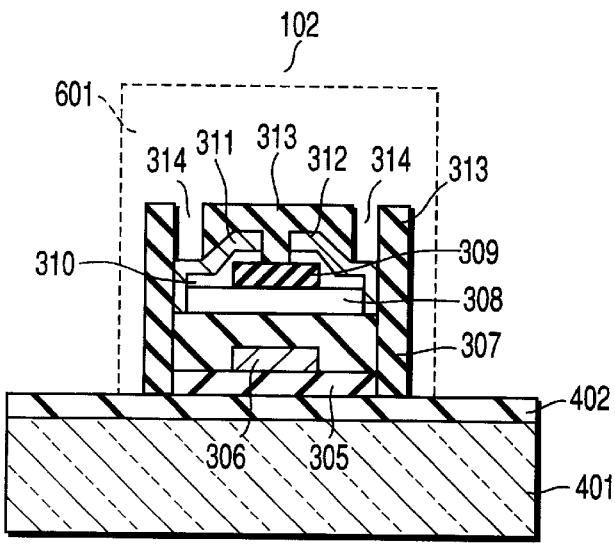
FIGS. 5B and 5C are modified examples of FIG. 5A.
Figure 5C:
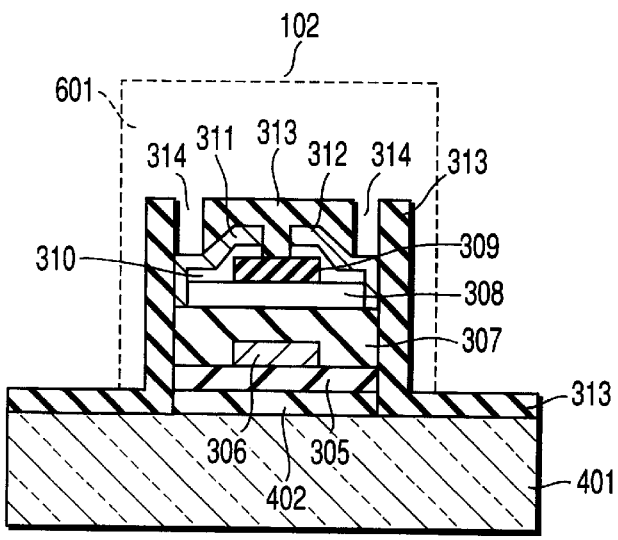

Note that the passivation layer 313 may be formed after etching of the gate insulating layer 307 or the undercoat layer 305 for separating the element to be transferred (described later), as shown in FIGS. 5B or 5C. This enables the passivation film 313 to cover the sides of the gate insulating film 307, with the result that the reliability of the TFT and the LCD is enhanced.

Now, a method of transferring the TFT from the element formation substrate 401 to an intermediate transfer substrate 701 will be explained with reference to FIGS. 6 to 10. Note that a detailed structure of the TFT element is omitted from FIGS. 6 to 10.

Figure 6:
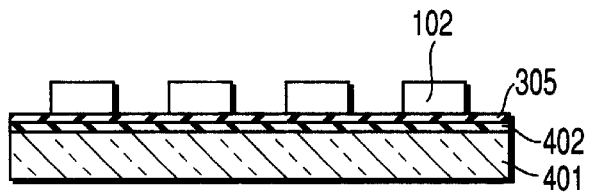
FIGS. 6 to 10 are cross-sectional views sequentially showing steps starting from formation of elements to formation of an intermediate transfer substrate, in a method of manufacturing an active matrix substrate according to the first embodiment of the present invention.
Figure 7:
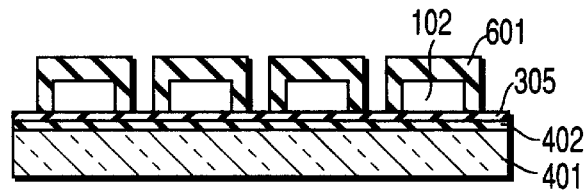

As shown in FIG. 6, the etching stopper layer 402, the undercoat layer 305, and TFTs 102 are formed on the element formation substrate 401. Each of TFTs 102 is individually covered with a protective layer 601 as shown in FIG. 7. As the protective layer 601, a rubber-base negative resist is used in this embodiment. However, use may be made of an organic resin or the like having a heat resistance and a mechanical strength. The protective layer 601 is formed larger than TFT 102 horizontally and vertically by about 2–40 μm (as shown by a broken line in FIG. 5) so as to cover the entire TFT 102.

Thereafter, dry-etching is performed to remove the portions of the etching stopper layer 402 and the undercoat layer 305 not covered with the protective layer 601. The etching stopper layer 402 and the undercoat layer 305 formed under TFTs are separated from each other.

Figure 8:
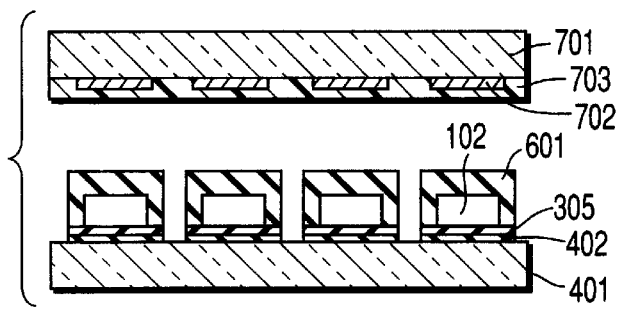

Now, as shown in FIG. 8, light absorbers 702 are formed on an intermediate transfer substrate 701 made of transparent glass at the positions corresponding to individual TFTs 102. Then, an adhesion/exfoliation layer 703 is formed over all light absorbers 702. The light absorber 702 is formed of a metal film such as, MoTa, MoW or the like. The light absorber 702 is blackened at a surface facing the intermediate transfer substrate 701. The light absorber 702 preferably has a good heat conductivity. When heat is applied, the adhesion/exfoliation layer 703 is reduced in viscosity, losing adhesiveness. As the adhesion/exfoliation layer 703, a wax such as Apeazon wax (manufactured by Apeazon Product Limited) may be used. Alternatively, a material which develops foams by heat application and loses its adhesiveness, for example, Riba-alpha (manufactured by Nitto Denko corporation), may be used. It is preferable that the intermediate transfer substrate 701 should have the same thermal expansion coefficient as the element formation substrate 401.

Figure 9:
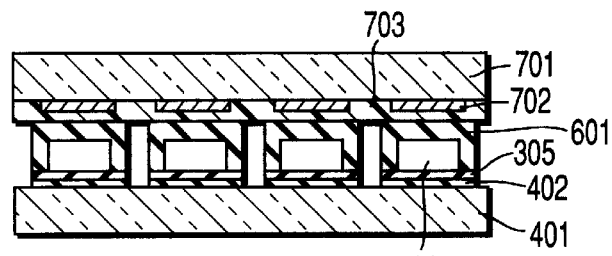

The light absorbers 702 are aligned with the corresponding protective layers 601 of the TFTs 102. As a result, the structure shown in FIG. 9 is obtained, in which the adhesion/exfoliation layer 703 is in contact with the protective layers 601.

After the peripheral side surface of the intermediate transfer substrate 701 is protected with a tape or the like, the element formation substrate 401 is etched with a solution mixture of hydrofluoric acid and a surfactant. The etching is controlled so as to stop by the etching stopper layer 402.

The etching may be performed by a mechanical etching method to a substantial amount, followed by a chemical etching method. It is preferable to adopt a uniformly-etchable chemical etching method to enhance etching selectivity of the etching stopper layer 402.

Figure 10:
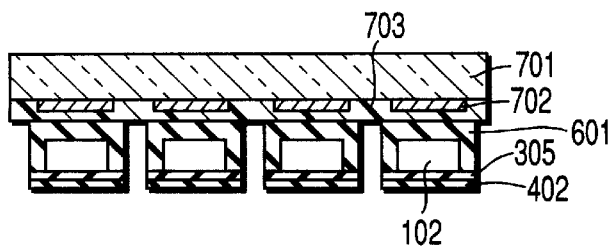

Alternatively, a stacked layer of an amorphous silicon film and a silicon nitride film may be used in place of the etching stopper layer 402. In this case, a material easily causing a laser ablation is formed under the stacked layer, and then, a laser light is applied through the element formation substrate 401. In this manner, the TFT 102 is separated. As the material easily causing a laser ablation, use may be made of hydrogenated amorphous silicon, an insulating film containing a gas such as a silicon nitride film formed at a low temperature, and polyamide having imide at a low rate. In this manner, the TFT 102 may be transferred to the intermediate transfer substrate 701 as shown in FIG. 10.

Next, a method of forming wirings of a final transfer substrate 301 will be explained with reference to FIGS. 11 to 15.

As the material for the final transfer substrate 301, a glass substrate such as no-alkali glass or soda-lime glass, or a plastic substrate, may be used. A no-alkali glass substrate is used in this embodiment.

Figure 11:
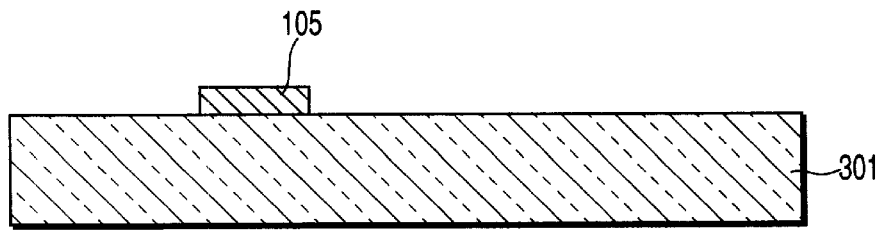
FIGS. 11 to 15 are cross-sectional views sequentially showing steps of forming wiring on a final transfer substrate in the method of the first embodiment of the present invention.

First, as shown in FIG. 11, a scanning line 105 of about 1–5 $\mu$m thick and 30 $\mu$m wide is formed by applying a conductive resin paste on the final transfer substrate 301 in accordance with screen printing, forming a pattern, and annealing at about 450–600° C. Alternatively, the scanning line 105 may be formed by attaching a photosensitive conductive film such as Fodel etc.(made of Du Pont-Mitsui Polychemicals company Ltd.) and forming a pattern by exposing the photosensitive conductive film to light through a photomask. As a further alternative method, the scanning line 105 may be formed by forming a thin film in accordance with a deposition or sputtering method, subjecting the resultant film to light exposure with a resist as a mask, and applying etching to the film.

Figure 12:
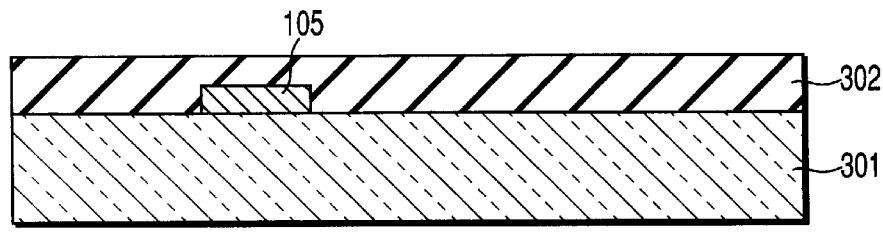

Then, an interlayer insulating layer 302 is formed on the resultant structure, as shown in FIG. 12. The interlayer insulating layer 302 is formed by stacking two layers of silicon oxide films containing phosphorus, each being formed by coating the silicon oxide and baking the coated film at about 600° C. As mentioned above, if an additive is doped in the silicon oxide film and the silicon oxide film is subjected to reflowing at a low temperature, the resultant interlayer insulating film 302 is formed with few number of pin holes. The interlayer insulating layer 302 may be formed of an inorganic film, polyimide, acrylic resin, benzocyclobutene (BCB), or the like.

Figure 13:
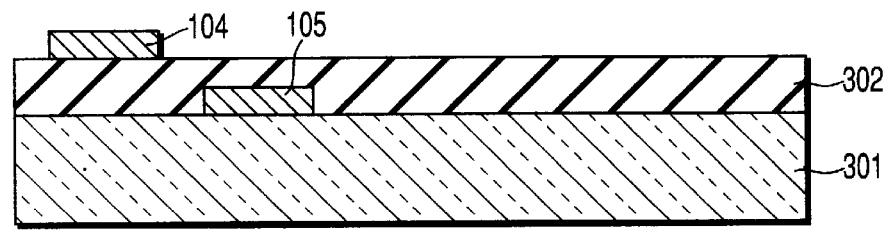
Figure 14:
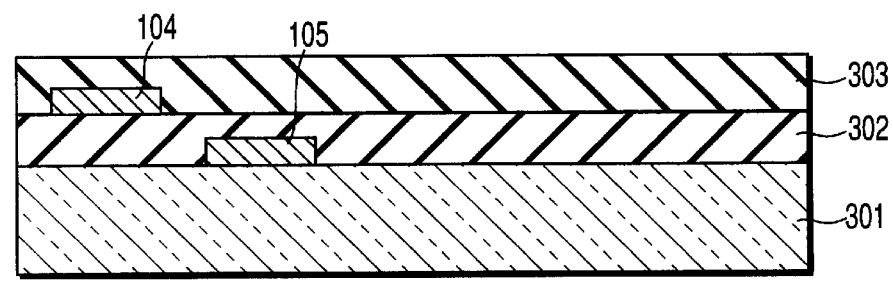

A signal line 104 is formed on the interlayer insulating layer 302 in a width of about 30 $\mu$m and a thickness of about 1–3 $\mu$m by using the same material and in the same manner as in the scanning line 105, as shown in FIG. 13. A flattening layer 303 is then formed on the signal line 104, as shown in FIG. 14. The flattening layer 303 is formed by applying an acrylic resin in a thickness of about 2 to 20 $\mu$m and annealing it, thereby softening it. As a result, the height difference between the projections and depressions on the surface of the flattening layer 303 falls within about 0.5 $\mu$m. BCB, which is fluidized when heated, is preferably used as the flattening layer 303 since it is effective in flattening the surface. Alternatively, an inorganic insulating layer is formed and polished to obtain the flat layer.

Figure 15:
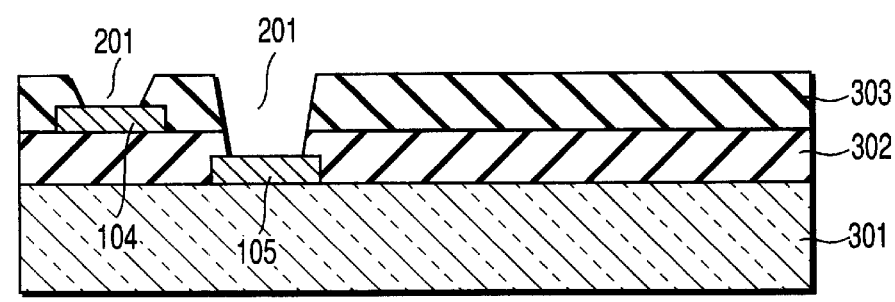

Furthermore, as shown in FIG. 15, a photoresist is applied on the interlayer insulating layer 302 and the flattening layer 303. The resultant structure is exposed to light and developed to obtain a mask, and thereafter, subjected to etching. In this manner, contact portions 201 are formed on the signal line 104 and the scanning line 105.

Then, a TFT formed on the intermediate transfer substrate 701 is transferred to the final transfer substrate 301 having wiring formed thereon. The transfer step will be explained with reference to FIGS. 16 to 19. Note that a detailed structure of the TFT 102 is omitted in FIGS. 16 to 19.

Figure 16:
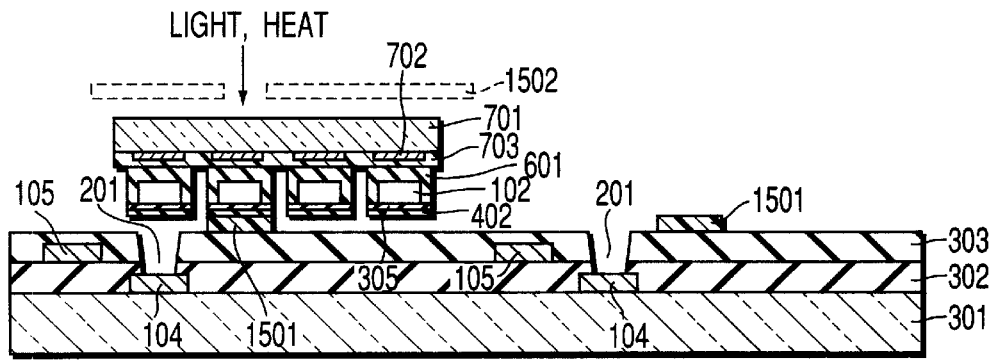
FIGS. 16 to 19 are cross sectional views sequentially showing steps of transferring an element to the final transfer substrate in the method of the first embodiment of the present invention.

First, as shown in FIG. 16, an acrylic resin adhesion layer 1501 for adhering an element is formed on the flattening layer 303 of the final transfer substrate 301 having wiring thereon, in a thickness of about 0.1 to 1 $\mu$m in accordance with screen printing. After the intermediate transfer substrate 701 is aligned with the adhesion layer 1501, the TFT 102 to be transferred and the adhesion layer 1501 are adhered to each other. Thereafter, light is selectively applied onto the upper portion of the TFT 102 through the intermediate transfer substrate 701. In this manner, the light absorber 702 is heated. Since the adhesiveness of the adhesion/exfoliation layer 703 is lowered by heat application, the TFT 102 is separated from the intermediate transfer substrate 701 and adhered onto the final transfer substrate 301. In this light irradiation method, light may be applied onto the entire surface of the substrate, while the TFT 102 to be not transferred on the intermediate transfer substrate 701 is covered with an appropriate light-shield mask 1502 (indicated by a broken line in FIG. 15) in such a way that the TFT 102 is not irradiated. Alternatively, a projecting portion may be formed under the adhesion layer 1501 as a support.

Although the light absorber 702 is used herein, a thin film heating element made of a metal such as Ta having a large resistivity may be used in place of the light absorber 702. The thin film heating element produces heat by application of voltage. In this case, the thin film heating elements arranged in a matrix are selectively heated in units. It is therefore possible to exclusively heat the TFT 102 to be transferred. Alternatively, in place of the material forming the adhesion/exfoliation layer 703 whose adhesiveness decreases by heat application, use may be made of a material which gains adhesiveness by heat application and loses adhesiveness by UV irradiation. More specifically, an alkaline series adhesive agent including ultraviolet-degradable benzophenone may be used. In this case, the ultraviolet ray may be selectively applied to the TFT 102 to be transferred. Alternatively, the ultraviolet ray may be applied to the substrate with a mask pattern formed thereon which has an opening corresponding to the size of the TFT 102.

Figure 17:
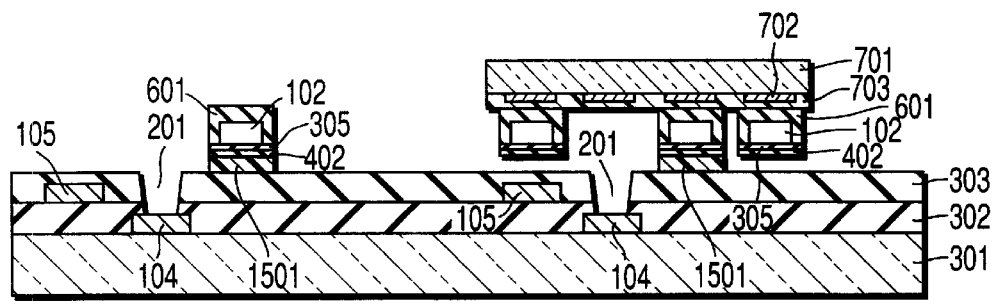

As shown in FIG. 17, the TFTs 102 are transferred repeatedly, with the result that a plurality of TFTs 102 are adhered at predetermined positions. An additional step of applying heat or ultraviolet rays may be provided for securely adhering the TFTs.

Figure 18:
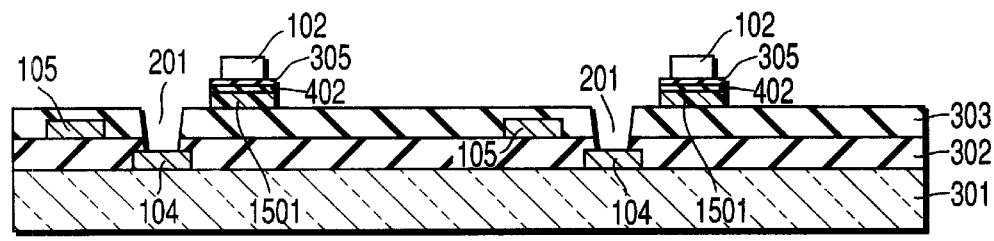

Subsequently, as shown in FIG. 18, the protective layer 601 is removed by using a resist removing liquid. The removing step of the protective layer 601 may be set once after all TFTs 102 are transferred or may be repeated every after a single TFT is transferred.

Figure 19:
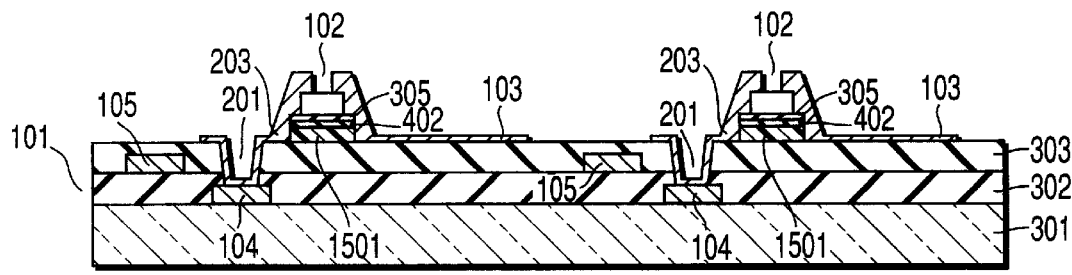

Thereafter, an ITO film is deposited on the entire surface of the final transfer substrate 301 by sputtering and a photoresist is applied and then patterned. In this manner, a connecting electrode 203 is formed for connecting the signal line 104 to the TFT 102, as shown in FIG. 19. Simultaneously, the pixel electrode 103 is formed. In the steps mentioned above, the active matrix substrate 101 for use in a liquid crystal display device is completed.

In the first embodiment, the elements (TFTS) formed on the element formation substrate 401 or the intermediate transfer substrate 701 differs in density from those formed on the final transfer substrate 301. Then, we will explain how to transfer the TFTS 102 when the elements formed on the intermediate transfer substrate differs in density from those formed on the final transfer substrate, with reference to FIGS. 20A to 24B. Note that a detailed structure of the TFT 102 is omitted in these figures.

Figure 20A:
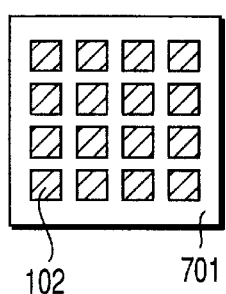
FIGS. 20A to 24B are plan views subsequently showing steps of transferring a plurality of elements from the intermediate transfer substrate to the final transfer substrate, in one operation, in the method of the first embodiment of the present invention.

A plurality of TFTs 102 regularly arranged on the element formation substrate 401 are transferred to the intermediate transfer substrate 701, as shown in FIG. 20A. The TFTs 102 are arranged on the element formation substrate 401 with a larger density than on the final transfer substrate 301. The TFTs 102 are arranged on the element formation substrate 401 at arrangement intervals (pitches) each being an integral multiple of the interval (pitch) of the TFTs 102 on the final transfer substrate 301, in both row and column directions. This method is advantageous in productivity since the density of elements formed on the element formation substrate is increased and a plurality of TFTs 102 are transferred. In this embodiment, the case is explained where the interval (pitch) of TFTs on the final transfer is twice as large as that on the element formation substrate (that is, arranged with a ¼ density).

Figure 20B:
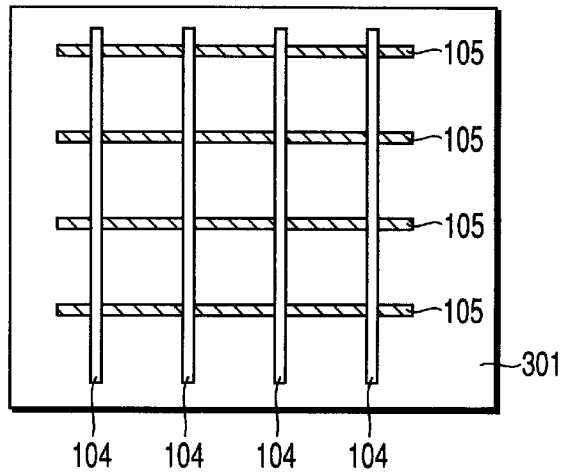

The TFTs 102 transferred to the intermediate transfer substrate 701 are selectively transferred to the final transfer substrate 301 having the signal lines 104 and the scanning lines 105 formed thereon, as shown in FIG. 20B.

Figure 21A:
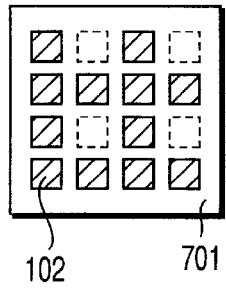
Figure 21B:
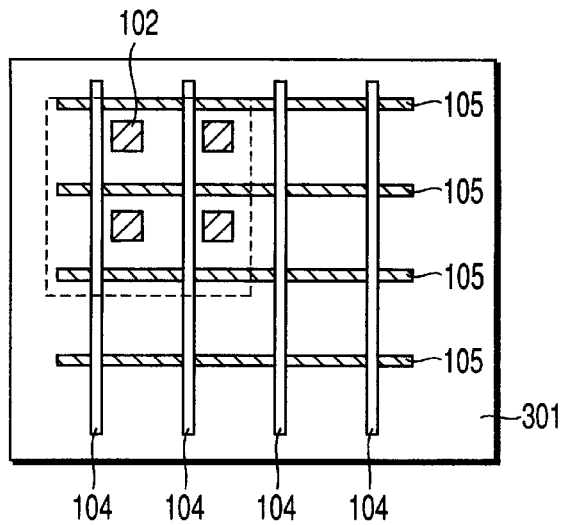
Figure 22A:
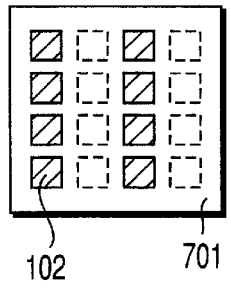
Figure 22B:
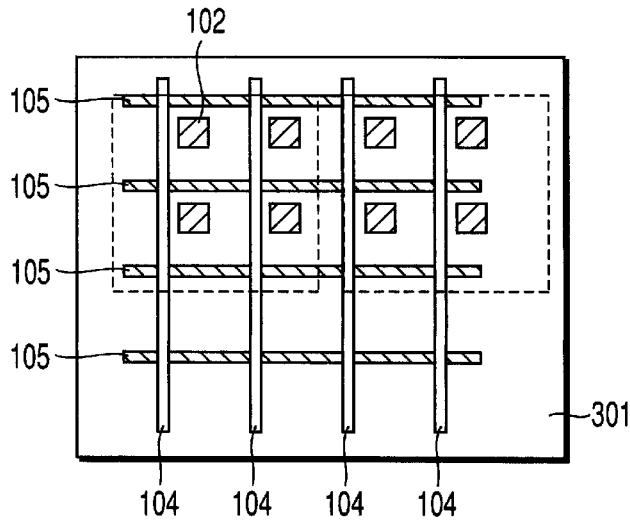
Figure 23A:
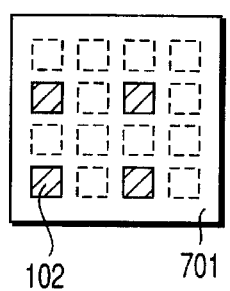
Figure 23B:
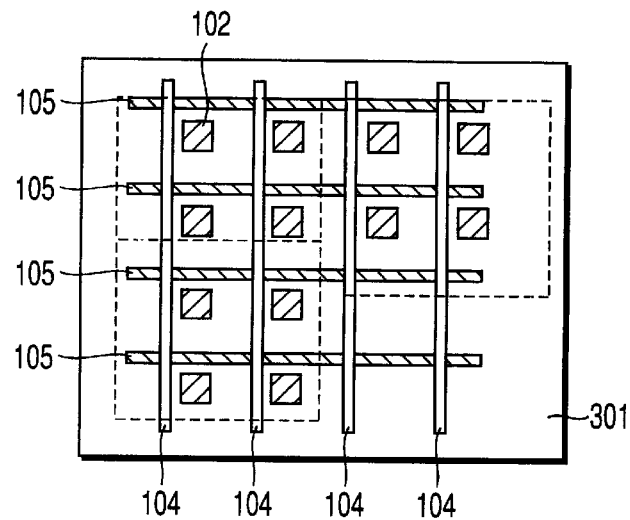
Figure 24A:
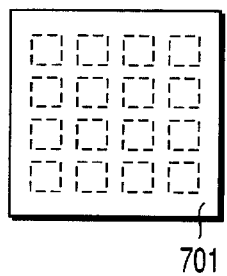
Figure 24B:
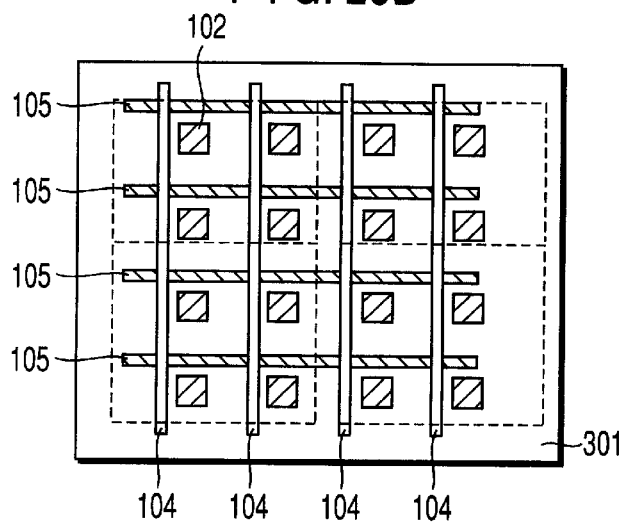

More specifically, as shown in FIGS. 21A and 21B, TFTs 102 are transferred to the predetermined four regions of the final transfer substrate 301 by a first transfer operation. Since TFTS 102 are formed on the intermediate transfer substrate 701 with the density which is 4-fold as high as that of the final transfer substrate 301, TFTs 102 on the intermediate transfer substrate 701 are alternately selected and transferred to the final transfer substrate 301.

After the first transfer, as shown in FIGS. 22A, 22B, 23A, 23B, 24A and 24B, the intermediate transfer substrate 701 is shifted and another 4 TFT element group alternately arranged are transferred. This procedure is repeated.

By virtue of this transfer method, the element formation substrate 401 can be formed in a smaller size than the final transfer substrate 301. For example, in a HDTV having a diagonal length of 52 inches, pixels are arranged at intervals (pitches) of about 200 μm in the row direction and about 600 μm in the column direction. In this case, if the TFTs 102 are arranged at 100 μm intervals (pitches) in both the row and column directions, the size of the element formation substrate 401 may be 1/12 of the final transfer substrate 301. If the element formation substrate 401 (650 mm×650 mm) is used, it is possible to form TFTs corresponding to 4 HDTV screens of 52-inch diagonal length.

In the aforementioned embodiment, 4 TFTs are selected alternately without exception. However, if necessary, a unit of two adjacent TFTs may be alternately selected.

Above the active matrix substrate 101 thus obtained, an opposing glass substrate 2403 is arranged and fixed at an appropriate interval (cell gap) of about 2–6 μm from the substrate 101. The opposing glass substrate 2403 has a color filter 2401 and an opposing electrode 2402 formed thereon. Subsequently, the cell gap is filled with liquid crystal 2404 to form a liquid crystal device.

In the liquid crystal display device, 16 TFTs 102 as shown in FIG. 20A are transferred alternately. All 16 TFTs can be transferred by four transfer operations. Since alignment is performed only four times, a high productivity is resulted. Since a plurality of TFTS 102 can be simultaneously transferred, all TFTs 1102 can be transferred in fewer times, as described in the above. Therefore, the productivity is improved. Moreover, the TFTs are arranged uniformly, so that the yield is improved.

Furthermore, since TFTs 102 are formed on the element formation substrate 401 by using a conventional assembly line, the investment cost can be reduced. Moreover, the short circuit between wiring elements or layers can be repaired before the TFTs are transferred on the final transfer substrate. It is therefore possible to obtain a high productivity.

In addition, it is possible to avoid installation of a defective TFT 102. For example, the TFT 102 formed on the element formation substrate 401 can be checked for defect by an array tester or the like. Therefore, transfer of the defective TFT is prevented. In place of the defective TFT not transferred, a non-defective TFT is transferred later.

Since each TFT 102 is formed on the separated undercoat layer 305 per TFT, no distortion occurs in an underpart layer, such as the gate electrode, gate insulating layer or amorphous silicon layer, of the TFT 102. As a result, reliability is improved. If the distortion is prevented, properties of TFT will not be changed. Moreover, exfoliation will not occur at the time the TFTS are transferred. Therefore, adhesion reliability can be improved.

Furthermore, according to the first embodiment, it is possible to combine the TFT manufactured accurately and the wiring manufactured less accurately on a large substrate. More specifically, TFT of several hundreds of μm in dimension having the gate insulating layer 307 of about several hundreds of nm in thickness can be combined with the substrate having the wiring of 30 μm in width. Therefore, a large-screen display can be obtained at a low cost.

Note that the unit to be transferred is not limited only to the TFT 102, but a circuit constituted of a plurality of transistors can be transferred. If a selecting transistor and a driving transistor controlled by the selecting transistor in a pixel can be transferred by using this technique, the resultant product can be used as a driving unit for liquid crystal and EL.

Second Embodiment

In the second embodiment, a plurality of circuit units each having not only an element but also wiring and a pixel electrode formed thereover are formed on the element formation substrate. The circuit units are divided and transferred a plurality of times. In this manner, a single active matrix substrate 101 is formed. Now, we will explained a method for forming the active matrix substrate 101 according to the second embodiment with reference to FIGS. 26 to 31. In these figures, a detailed structure of the circuit unit including TFTs is omitted. Note that like reference numerals are used to designate like structural elements corresponding to those in the first embodiment. Overlap explanation is omitted.

Figure 26:
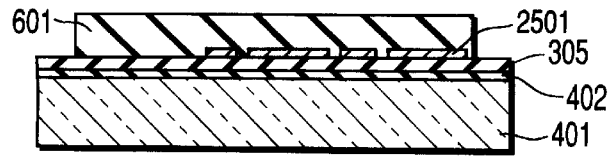
FIGS. 26 to 31 are cross sectional views sequentially showing a method of manufacturing an active matrix substrate according to a second embodiment of the present invention.

As shown in FIG. 26, an etching stopper layer 402 and, an undercoat layer 305 are stacked on an element formation substrate 401 made of glass. Then, a circuit unit 2501 is formed of TFTs, signal lines, scanning lines, pixel electrodes, and etc. Individual layers of the second embodiment are formed in the same manner as in the first embodiment. Subsequently, a protective film 601 is formed so as to cover the entire circuit unit 2501. The etching stopper layer 402 and the undercoat layer 305 are etched in the same size as of the protective film 601. The protective film 601 is processed by photolithography with a dimensional accuracy of about 1–20 μm.

Figure 27:
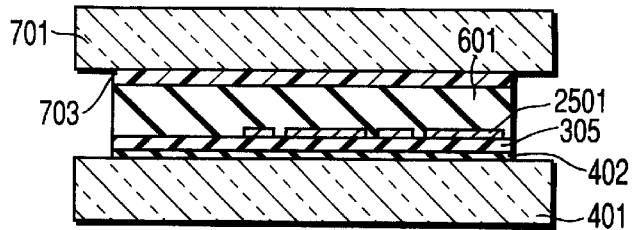
Figure 28:
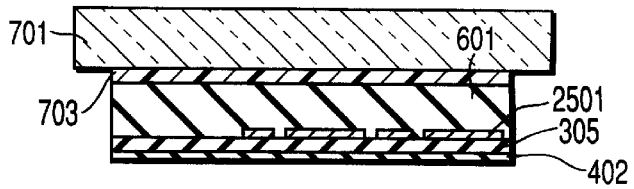

Subsequently, as shown in FIG. 27, the protective film 601 of the element formation substrate 401 is adhered to the intermediate transfer substrate 701 on which the adhesion/exfoliation layer 703 is formed in the same manner as in the first embodiment. Thereafter, as shown in FIG. 28, the element formation substrate 401 is etched away.

Figure 29:
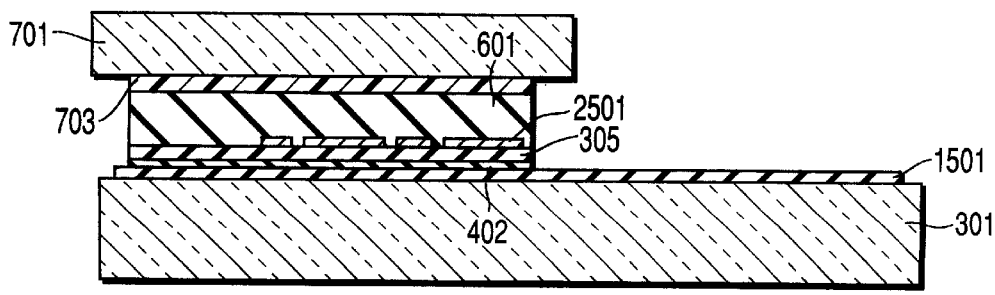
Figure 30:
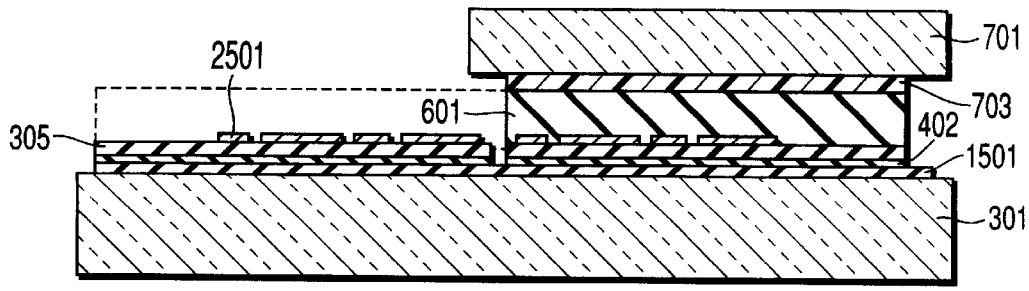
Figure 31:
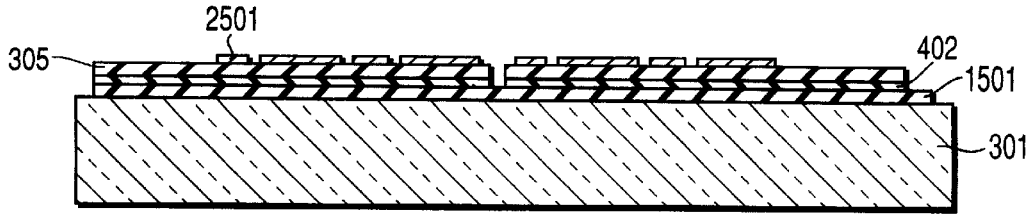

Next, as shown in FIG. 29, the circuit unit 2501 is positioned at a predetermined place of the final transfer substrate 301 having the adhesion layer 1501 formed thereon. The adhesion/exfoliation layer 703 is heated through the intermediate transfer substrate 701 to reduce the adhesiveness. In this manner, the circuit element 2501 is transferred to the substrate 301. The protective film 601 may be removed by using a resist removing liquid either after a first transfer operation or after a second transfer operation at which all elements and wiring are transferred, as shown in FIG. 30. In the manner mentioned above, the active matrix substrate 101 is formed, as shown in FIG. 31.

In the case where a single large active matrix substrate 101 is formed by transferring two circuits having elements and wiring formed thereon as is in the second embodiment, how accurately the circuits are bonded is a matter of primary concern.

FIG. 32 explains a method of forming the final transfer substrate 301 by transferring two element formation substrates 401 having elements and wiring formed thereon. FIG. 33 is a cross sectional view taken along the line 33—33 of FIG. 32. Note that a detailed structure of the TFT 102 is omitted in the FIGS. 32 and 33. As shown in FIG. 33, when the final transfer substrate 301 is formed by combining the element formation substrates 401, the interval Lg between a signal line 104 and a pixel electrode 103 within the same element formation substrate 401 can be set equal (about 8–15 $\mu$m) to the interval Lg2 between the pixel electrode 103 and a signal line 104 of another element formation substrate 401 boned thereto. This technique can be applied to form a high definition pixel for use in an HDTV. Bright images can be displayed in a large screen having a high aperture ratio. Since the pixels and the signal lines are arranged in the same manner as in a conventional active matrix substrate formed on the basis of a single substrate, high quality images can be obtained without a change of a pixel voltage caused by capacitive coupling, at the butt-joined portion of the active matrix substrates 101.

FIG. 34 shows the same transfer method as in FIG. 32. To enlarge the margin of the joint portion between the adjacent element formation substrates 401, the element formation substrates 401 are arranged linearly symmetric. FIG. 35 is a cross-sectional view taken along the line 35—35 of FIG. 34. Note that a detailed structure of the TFT 102 is omitted in FIGS. 34 and 35.

In this case, it is preferable that the interval Lp1 between the pixel electrodes 103 in one element formation substrate 401 is equal to the interval Lp2 between the pixel electrodes 103 at a butt-joined portion where the element formation substrate 401 is bonded to another one. Assuming that the width of the signal line 104 is about 30 $\mu$m and the interval between the pixel electrode 103 and the signal line 104 is about 5 $\mu$m, the substrates are easily butt-jointed by setting Lp1=Lp2=about 40 $\mu$m.

Since no wiring is formed at the butt-jointed portion of the active matrix substrates 101, the capacitive coupling between the wiring and the pixel electrode 103 differs from those of other portions. Therefore, if necessary, supplemental signals may be provided to the butt-joined portion.

In the second embodiment, a large active matrix substrate 101 is prepared in one piece, without joining two substrates. Therefore, this case is free from the following problems: the butt-joined portion of the two substrates becomes thicker and elements and wiring are formed at different heights between two substrates, with the result that the elements and wiring come in touch with the opposing substrate.

A glass substrate is used as the final transfer substrate 301, in the second embodiment. However, use may be made of a plastic substrate, resin film, ceramic substrate, thin metal-film substrate, or the like. Conventionally, it is difficult to manufacture a high definition pixel accurately by use of the plastic substrate or the resin film. This is because they have a large thermal distortion and thermal expansion coefficient. However, in the method of the present invention, it is possible to form the elements (circuit unit) on the element formation substrate 401 with the same accuracy as in the case where the elements are formed on the conventionally-used glass substrate. Since the accurately formed elements are just transferred to the final transfer substrate, it is possible to form a high definition image of 200 ppi on the plastic substrate or the resin film.

Third Embodiment

In the first embodiment, after all wirings are formed on the final transfer substrate, the TFTs 102 transferred to the intermediate transfer substrate are further transferred to the final transfer substrate. However, in the third embodiment, after the TFTs are transferred to the final transfer substrate, an interlayer insulating film and then the wiring is formed on the final transfer substrate. Like reference numerals are used to designate like structural elements corresponding to those of the first embodiment, and overlap explanation is omitted.

FIG. 36 is a schematic sectional view showing the TFT102 transferred to the final transfer substrate 301 and wirings (scanning line, signal line) formed on the final transfer substrate 301. FIG. 37 is a schematic plan view of a single pixel at a corner portion of the active matrix substrate. FIG. 36 is a cross sectional view taken along the line 36—36 of FIG. 37. Now, the method of manufacturing the pixel will be explained subsequently from the beginning.

First, the TFT 102 is formed on the element formation substrate 401 in the same manner as in FIGS. 6 to 10 of the first embodiment. The TFT 102 thus formed is transferred to the intermediate transfer substrate 701 and then transferred to the final transfer substrate 301 on which wiring (scanning line) 105 is made of conductive resin, metal and the like. The wiring 105 may be formed after the TFT 102 is transferred.

Subsequently, an interlayer insulating layer 3001 of a photosensitive acrylic resin is formed so as to cover the TFT 102 and the wiring 105. It is not necessary to form the interlayer insulating layer 3001 by using an organic resin such as an acrylic resin. The interlayer insulating layer 3001 may be formed of an inorganic insulating material such as $SiO_2$.

Next, a contact hole for connecting to an upper wiring is formed in the above portion of the TFT 102 and in the interlayer insulating layer 3001 on the wiring 105. When the interlayer insulating layer is made of a photosensitive acrylic resin, a contact hole can be formed by exposing the resin itself to light. However, when the interlayer insulating layer is made of $SiO_2$, the contact hole may be formed by applying a resist and then subjecting to a conventionally-performed lithographic step.

Next, a pixel electrode 103 is formed on the interlayer insulating layer by ITO. Then, the pixel electrode 103 is connected to one of the source/drain electrodes of the TFT by the signal line 104. Furthermore, the scanning line 105 and the gate electrode (not shown) of the TFT 102 are connected by the connecting electrode 203 (the connecting site is not shown). The signal line 104 and the connecting electrode 203 are formed of the same material (e.g., a conductive resin) as used in the scanning line 105.

The scanning line 105 and the TFT 102 on the final transfer substrate 301 are covered with the interlayer insulating layer 3001. Since they are covered with the interlayer insulating film 3001, breakage of the signal line 104 is prevented even if the adhesion layer 304 extends off from the edge of the TFT 102 or the adhesion layer slightly curls up. As a result, the yield is improved. The interlayer insulating layer 3001 can also serve as the passivation layer of TFT 102.

Figure 25:
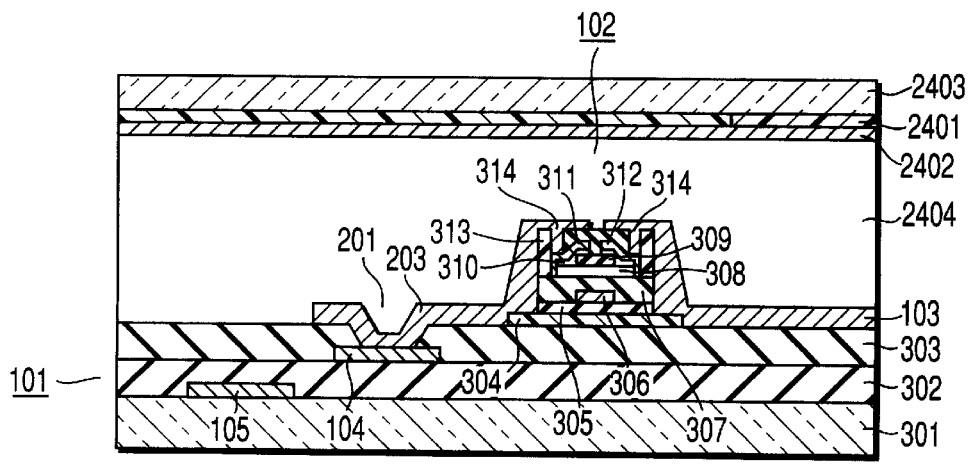
FIG. 25 is a cross sectional view of a liquid crystal display device using the active matrix substrate according to the first embodiment of the present invention.

The later steps are performed in the same manner as in the first embodiment. As a result, the active matrix substrate similar to that of FIG. 25 is completed.

As a modified example of the third embodiment, the scanning line 105 may be formed on the interlayer insulating layer 3001. Furthermore, another interlayer insulating film 3002 is formed and a signal line 104 may be formed on the interlayer insulating film 3002. Alternatively, as shown in FIG. 38, after the signal line 104 is formed on the interlayer insulating film 3601, the interlayer insulating layer 3002 is formed, and the pixel electrode 103 may be formed on the interlayer insulating layer 3002 so as to overlap with the TFT 102. As described in the foregoing, it is possible to realize a display device having a large aperture ratio by overlapping the TFT 102 and the pixel electrode, as shown in FIG. 39.

Note that a plurality of elements may be selectively transferred on the final transfer substrate in the third embodiment, as explained in the first embodiment with reference to FIGS. 20A to 24B.

Fourth Embodiment

In the fourth embodiment, a three-layer micro capsule reflective LCD is formed by use of the circuit-unit transfer technique explained in the second embodiment. FIG. 40 is a cross-sectional view showing the state that a single pixel of the liquid crystal display according to the fourth embodiment is formed on the element formation substrate 401. Like reference numerals are used to designate like structural elements corresponding to those of the first and second embodiments and overlap explanation is omitted.

First, the etching stopper 402 and the undercoating layer 305 are formed on the element formation substrate 401 in the same manner as in the first embodiment. After the gate electrode 306 of the TFT 102 is formed on the undercoat layer 305, a gate insulating layer 307 is formed.

After a semiconductor layer 308, a channel protecting insulating layer 309, source/drain electrodes 310 are formed on the gate insulating layer 307 in the same manner as in the first embodiment, an interlayer insulating layer 313 is formed so as to cover the TFT 102. The interlayer insulating layer 313 is preferably flattened. A contact hole is formed in the interlayer insulating layer 313 in which one of the source/drain electrodes 310 is exposed. The first pixel electrode 103a is formed on the interlayer insulating layer 313 including the contact hole. The first pixel electrode 103a is connected to the one of the source/drain electrodes 310 exposed in the contact hole. The first pixel electrode 103a is a diffuse reflection electrode which is formed by sputtering a well-reflective Al, Ag alloy or the like. To impart good dispersion properties to the reflected light, it may be better to form uneven spots in the surface of the underlying interlayer insulating layer 313. This is because the metal surface of the first pixel electrode 103a formed thereon is formed unevenly in accordance with the uneven spots.

A spacer 3101 made of a photosensitive resin is formed at a portion next to the first pixel electrode on the interlayer insulating layer 313 by use of printing and photolithographic techniques. Furthermore, a metal layer of Al, Mo, Cr or the like is formed over the entire surface by sputtering. Photolithography is performed to selectively leave the metal layer on a side surface of the spacer 3101. In this way, a vertically extended intermediate connecting electrode 3102 is formed. To the resultant structure, liquid crystal capsules 3103a having a liquid crystal material and a pigment filled in a transparent capsule and dispersed in a solvent are printed and then dried. The capsule layer 3103a is reduced in thickness by drying. A liquid crystal layer of a first color is thus formed.

Then, a second pixel electrode 103b is formed by printing a transparent resin having ITO dispersed therein on the liquid crystal layer of the first color and connected to one of a second TFT source and drain (not shown) by an intermediate connecting electrode (not shown). On the resultant structure, a liquid crystal microcapsule layer 3103b of a second color is formed in the same manner as in the liquid crystal layer of the first color. On the second liquid crystal capsule layer 3103b, a third pixel electrode 103c is formed in the same manner as a second pixel electrode 103b. The third pixel electrode 103c is connected to one of a third TFT source/drain layers (not shown) through the intermediate connecting electrode 3102. On the second liquid crystal capsule 3103b, a liquid crystal capsule layer 3103c of a third color is formed in the same manner as mentioned above. In this way, liquid crystal layer consisting of three layers (three color) is formed.

On the liquid crystal layer of three layers, an opposite electrode 3104 of ITO is formed. Further on the opposite electrode 3104, an opposite substrate 3105 is formed by use of a TES film, PET film or the like.

The opposite substrate 3105 of the resultant structure is adhered to the intermediate transfer substrate 701 having an adhesion/exfoliation layer 703 formed thereon, in the same manner in the second embodiment as shown in FIG. 27. Thereafter, the element formation substrate 401 is etched away in the same manner in the second embodiment as shown in FIG. 28.

The resultant structure of the etching stopper 402 is transferred to a film-state final transfer substrate 301, with the water-soluble adhesion layer 1501 interposed between them, as shown in FIG. 41. FIG. 41 shows only a single pixel. A plurality of pixels are simultaneously transferred to a large substrate (final substrate) in the same manner as in the second embodiment. If the transfer operation is repeated a plurality of times, it is possible to achieve a liquid crystal display device having pixels arranged in a matrix form. However, the transfer operation may be done only once.

According to the fourth embodiment, after the second and third pixel electrodes and the vertically-extended intermediate electrode which connects the second and third pixel electrodes to the corresponding TFTs, are formed accurately, they are transferred onto the film-form final transfer substrate. It is therefore possible to realize a high definition pixel of about 200 ppi. The stacked liquid crystal structure is indispensable to obtain a bright reflection image with a good color-reproductivity in the reflective LCD.

According to the present invention, it is possible to manufacture an active matrix substrate providing a high definition image at a low cost even if a large substrate or a non-glass material is used.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A method of manufacturing an active matrix substrate comprising:
    a first step of forming a plurality of elements on a first substrate;
    a second step of forming wirings on a second substrate;
    a third step of transferring some elements selected from said plurality of elements onto said second substrate from said first substrate; and
    a fourth step of selectively connecting said some elements transferred onto said second substrate to said wirings,
    wherein said third step includes the steps of:
        forming an adhesion layer on a third substrate;
        transferring said plurality of elements formed on said first substrate to said third substrate by said adhesion layer;
        forming adhesion thick film pads at portions on said second substrate, said adhesion pads corresponding to said selected elements selectively transferred to said second substrate; and
        bonding said selected elements on said third substrate to said adhesion thick film pads, while other unselected elements on said third substrate are left spaced apart from said second substrate during said bonding step.

2. The method of manufacturing an active matrix substrate according to claim 1, wherein said step of transferring said plurality of elements formed on said first substrate to said third substrate by said adhesion layer includes the steps of:
    bonding said plurality of elements formed on said first substrate to said third substrate by said adhesion layer; and
    etching away said first substrate.

3. The method of manufacturing an active matrix substrate according to claim 1, wherein said third step includes a step of selecting said some elements such that a largest interval of two adjacent elements arbitrarily chosen from said some elements is larger than a largest interval of two adjacent elements arbitrarily chosen from said plurality of elements formed on said first substrate.

4. The method of manufacturing an active matrix substrate according to claim 1, wherein said third step includes a step of selecting said some elements at predetermined intervals thereamong, and a step of repeating said step of selecting said some elements.

5. The method of manufacturing an active matrix substrate according to claim 1, wherein said third step further includes a step of peeling off said some elements by heating said adhesion layer.

6. The method of manufacturing an active matrix substrate according to claim 5, wherein said third step further includes the steps of:
    forming a plurality of light absorbers on portions of said third substrate, which corresponds to portions on which said plurality of elements are to be bonded by said adhesion layer, and
    selectively heating portions of said adhesion layer by irradiating light to some light absorbers of said plurality of light absorbers correspondingly provided to said some elements to be transferred for peeling off said some elements.

7. The method of manufacturing an active matrix substrate according to claim 5, wherein said third step further includes the steps of:
    forming a plurality of heating members on portions of said third substrate, which corresponds to portions on which said plurality of elements are to be bonded by said adhesion layer, before the step of forming said adhesion layer, and
    selectively heating portions of said adhesion layer by some heating members of said plurality of heating members correspondingly provided to said some elements to be transferred for peeling off said some elements.

8. The method of manufacturing an active matrix substrate according to claim 1, wherein said first step includes the steps of:
    forming an underlying layer on said first substrate, said underlying layer including an etching stopper layer formed on said first substrate and an undercoat layer formed on said etching stopper layer;
    forming said plurality of elements on said underlying layer; and
    forming a protective layer individually on each of said plurality of elements, such that said plurality of elements are covered with said underlying layer and said protective layer.

9. The method of manufacturing an active matrix substrate according to claim 8, further comprising a step of separating said underlying layer including said etching stopper layer and said undercoat layer into sections such that said underlying layer remains only just under each of said plurality of elements.

10. The method of manufacturing an active matrix substrate according to claim 8, wherein said fourth step includes etching away said protective layer prior to connecting said some elements to said wirings.

11. A method of manufacturing an active matrix substrate comprising:
    a first step of forming a plurality of elements on a first substrate;
    a second step of transferring some elements selected from said plurality of elements onto a second substrate from said first substrate;
    a third step of forming wirings on said second substrate after said second step; and
    a fourth step of selectively connecting said some elements and said wirings,
    wherein said second step includes the steps of:
        forming an adhesion layer on a third substrate;
        transferring a plurality of elements formed on said first substrate onto said third substrate by said adhesion layer;
        forming adhesion thick film pads at portions on said second substrate, said adhesion thick film pads corresponding to said selected elements selectively transferred to said second substrate; and
        bonding said selected elements on said third substrate to said adhesion thick film pads, while other unselected elements on said third substrate are left spaced apart from said second substrate during said bonding step.

12. The method of manufacturing an active matrix substrate according to claim 11, herein said step of transferring said plurality of elements formed on said first substrate to said third substrate by said adhesion layer further comprises the steps of:
    bonding said plurality of elements formed on said first substrate to said third substrate by said adhesion layer; and
    etching away said first substrate.

13. The method of manufacturing an active matrix substrate according to claim 11, wherein said second step includes a step of selecting said some elements such that a largest interval of two adjacent elements arbitrarily chosen from said some elements is larger than a largest interval of two adjacent elements arbitrarily chosen from said plurality of elements formed on said first substrate.

14. The method of manufacturing an active matrix substrate according to claim 11, wherein said second step includes a step of selecting said some elements at predetermined intervals thereamong, and a step of repeating said step of selecting said some elements.

15. The method of manufacturing an active matrix substrate according to claim 11, wherein said second step further includes a step of peeling off said some elements by heating said adhesion layer.

16. The method of manufacturing an active matrix substrate according to claim 15, wherein said second step further includes the steps of:

forming a plurality of light absorbers on portions of said third substrate, which corresponds to portions on which said plurality of elements are to be bonded by said adhesion layer, and selectively heating portions of said adhesion layer by irradiating light to some light absorbers of said plurality of light absorbers correspondingly provided to said some elements to be transferred for peeling off said some elements.

17. The method of manufacturing an active matrix substrate according to claim 15, wherein said second step further includes the steps of:

forming a plurality of heating members on portions of said third substrate, which corresponds to portions on which said plurality of elements are to be bonded by said adhesion layer, before the step of forming said adhesion layer, and selectively beating portions of said adhesion layer by some heating members of said plurality of heating members correspondingly provided to said some elements to be transferred for peeling off said some elements.

18. The method of manufacturing an active matrix substrate according to claim 11, wherein said first step includes the steps of:

forming an underlying layer on said first substrate, said underlying layer including an etching stopper layer formed on said first substrate and an undercoat layer formed on said etching stopper layer;

forming said plurality of elements on said underlying layer; and forming a protective layer individually on each of said plurality of elements, such that said plurality of elements are covered with said underlying layer and said protective layer.

19. The method of manufacturing an active matrix substrate according to claim 18, further comprising a step of separating said underlying layer including said etching stopper layer and said undercoat layer into sections such that said underlying layer remains only just under each of said plurality of elements.

20. The method of manufacturing an active matrix substrate according to claim 18, wherein said fourth step includes etching away said protective layer prior to connecting said some elements to said wirings.

21. A method of manufacturing an active matrix substrate comprising:

a first step of forming an underlying layer on a first substrate, said underlying layer including an etching stopper layer formed on said first substrate and an undercoat layer formed on said etching stopper layer;

a second step of forming a plurality of circuit units, on said underlying layer, composed of at least one element and at least one wiring connected to said at least one element, followed by separating said underlying layer into sections such that said underlying layer remains only just under each of said plurality of circuit units;

a third step of bonding said plurality of circuit units formed on said first substrate to a third substrate via said underlying layer and an adhesion layer formed on said third substrate;

a fourth step of etching away said first substrate; and a fifth step of selectively transferring said plurality of circuit units adhered onto said third substrate to a second substrate.

22. The method of manufacturing an active matrix substrate according to claim 21, wherein said fifth step includes a step of selectively heating portions of said adhesion layer on which said plurality of circuit units to be transferred are formed, to thereby transfer said circuit units from said third substrate to said second substrate.

23. The method of manufacturing an active matrix substrate according to claim 21, wherein each of said plurality of circuit units includes a plurality of pixel electrodes, and said fifth step is repeated a plurality of times such that an interval between adjacent electrodes of said plurality of pixel electrodes is kept substantially constant through repeated transfer steps of said plurality of circuit units.

24. The method of manufacturing an active matrix substrate according to claim 21, wherein said undercoat layer includes at least a silicon nitride layer.

25. The method of manufacturing an active matrix substrate according to claim 21, wherein said fourth step includes etching away said first substrate with said underlying layer leaving to cover said plurality of circuit units, and said fifth step includes transferring said plurality of circuit units to said second substrate by said underlying layer.

26. The method of manufacturing an active matrix substrate according to claim 21, wherein said second step includes a step of forming a protective layer individually on each of said plurality of circuit units, such that said plurality of circuit units are covered with said underlying layer and said protective layer.

27. The method of manufacturing an active matrix substrate according to claim 26, wherein said fifth step includes etching away said protective layer.

* * * * *